United States Patent
Hickling

(10) Patent No.: US 10,630,329 B2
(45) Date of Patent: Apr. 21, 2020

(54) PROGRAMMABLE, FREQUENCY AGILE DIRECT CONVERSION DIGITAL RECEIVER WITH HIGH SPEED OVERSAMPLING

(71) Applicant: RFDirect Corp., Carson City, NV (US)

(72) Inventor: Ronald M. Hickling, Newbury Park, CA (US)

(73) Assignee: RFDirect Corp., Carson City, NV (US)

( * ) Notice: Subject to any disclaimer, the term of this patent is extended or adjusted under 35 U.S.C. 154(b) by 0 days.

(21) Appl. No.: 16/363,917

(22) Filed: Mar. 25, 2019

(65) Prior Publication Data
US 2019/0296784 A1 Sep. 26, 2019

Related U.S. Application Data

(60) Provisional application No. 62/647,009, filed on Mar. 23, 2018.

(51) Int. Cl.
*H04B 1/16* (2006.01)
*H04B 1/12* (2006.01)

(52) U.S. Cl.
CPC ............... *H04B 1/16* (2013.01); *H04B 1/12* (2013.01)

(58) Field of Classification Search
CPC .............. H04B 1/16; H04B 1/10; H04B 1/12
See application file for complete search history.

(56) References Cited

U.S. PATENT DOCUMENTS

| | | | |
|---|---|---|---|
| 9,106,316 B2 * | 8/2015 | Sorrells | H04B 1/525 |
| 9,166,528 B2 * | 10/2015 | Sorrells | H03F 1/32 |
| 10,164,663 B2 * | 12/2018 | Shin | H03M 13/3927 |
| 2013/0101074 A1 * | 4/2013 | Hickling | H04B 1/10 375/350 |

* cited by examiner

*Primary Examiner* — Khanh C Tran
(74) *Attorney, Agent, or Firm* — Socal IP Law Group LLP; Jonathan Pearce; Angelo Gaz

(57) ABSTRACT

The invention described herein is directed to different embodiments of a wireless communications device that can be used in many different applications, such as but not limited to a digital oversampling receiver adapted to select desired signals and to reject undesired signals. In one embodiment, a wireless communications device is disclosed that comprises an architecture for a receiver front end that obviates the need for high order passive circuitry or RC active circuitry to select desired signals and to reject undesired signals.

12 Claims, 13 Drawing Sheets

(c) 2019 RFDirect Corp.

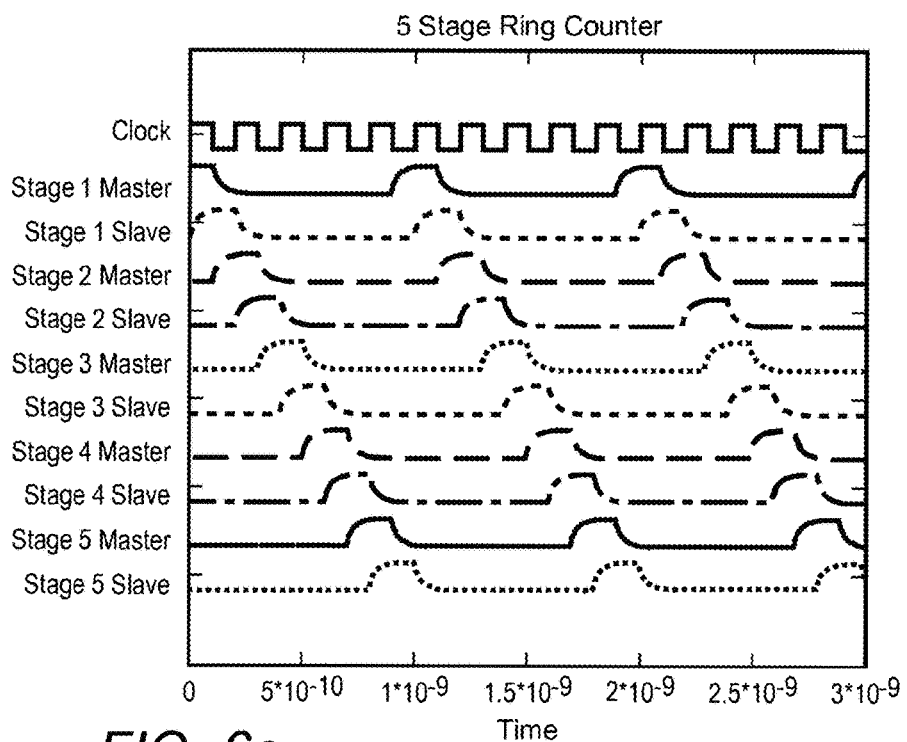
FIG. 6a
FIG. 6b
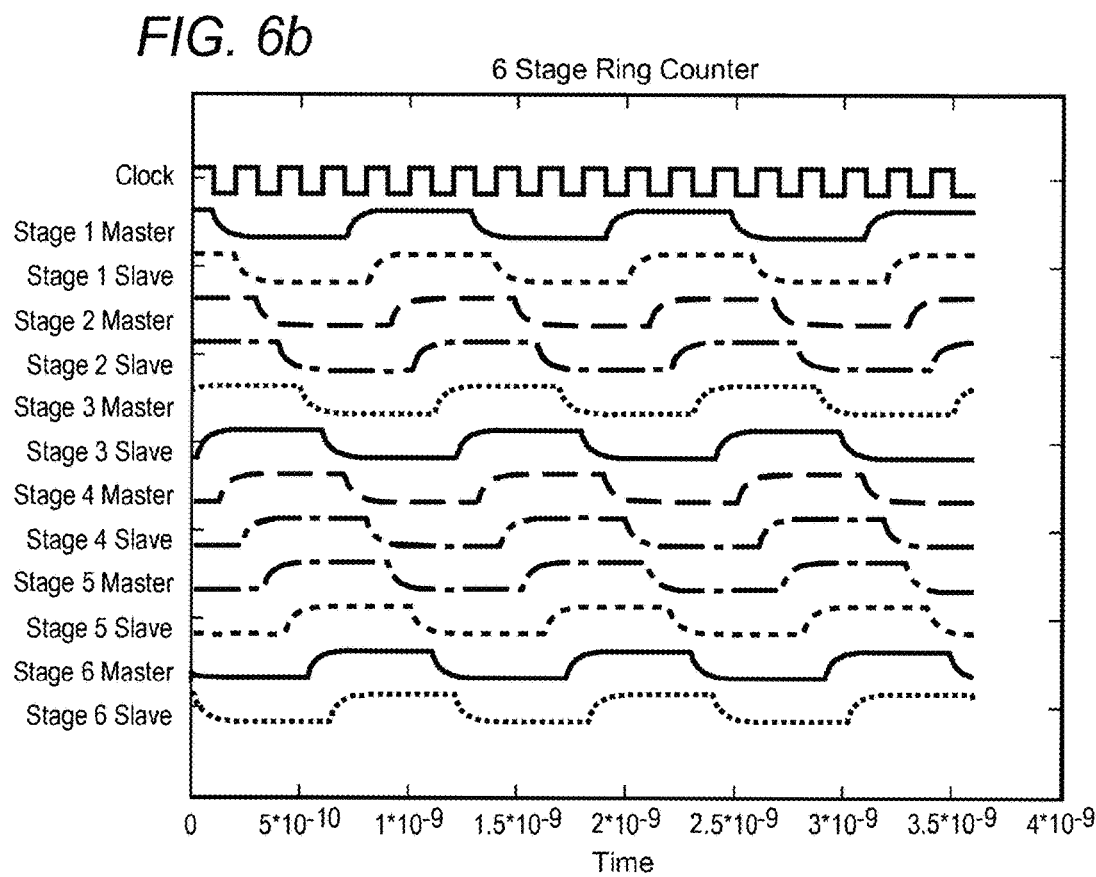

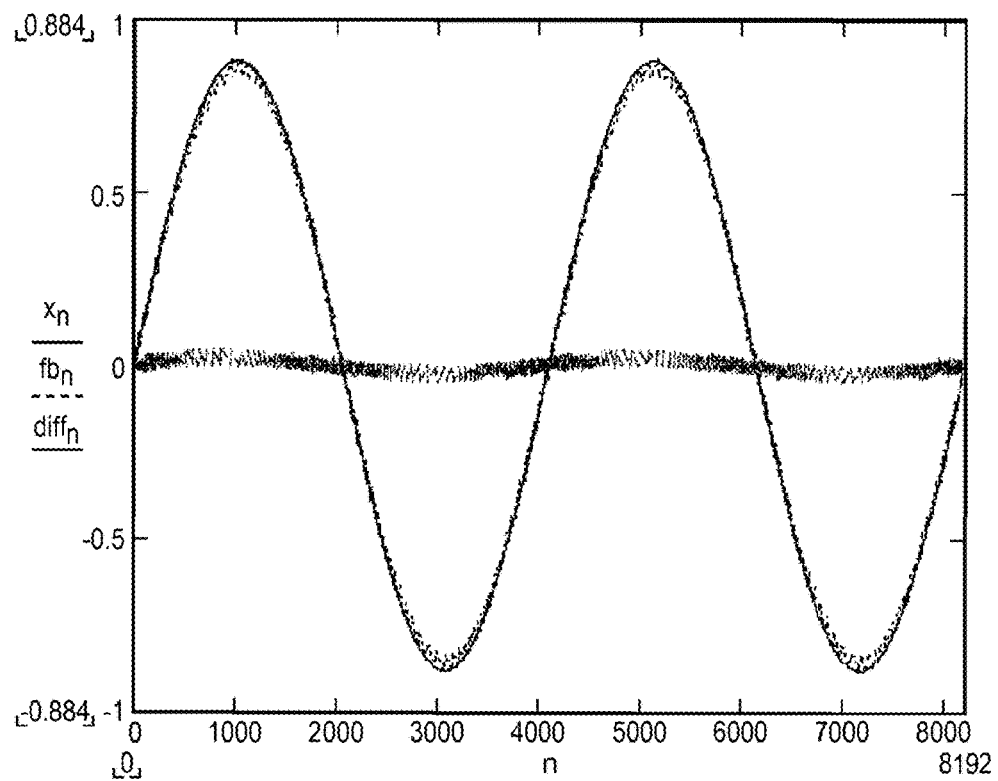
FIG. 10a
FIG. 10b
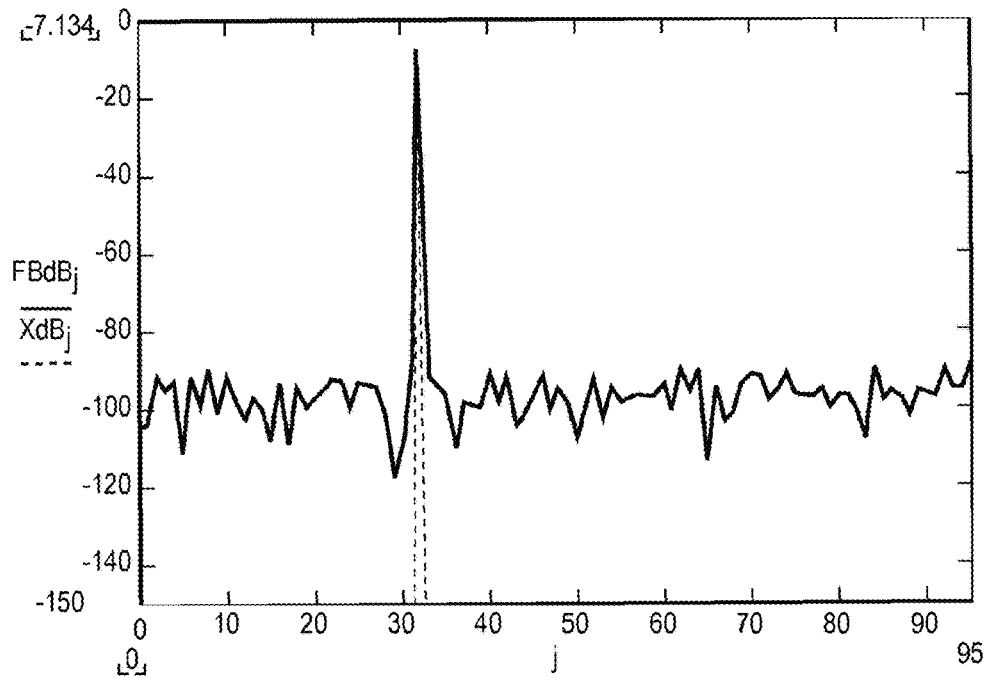

PROGRAMMABLE, FREQUENCY AGILE DIRECT CONVERSION DIGITAL RECEIVER WITH HIGH SPEED OVERSAMPLING

RELATED APPLICATION INFORMATION

This patent claims priority from the following provisional patent application:

U.S. Provisional patent application No. 62/647,009, entitled "PROGRAMMABLE, FREQUENCY AGILE DIRECT CONVERSION DIGITAL RECEIVER WITH HIGH SPEED OVERSAMPLING" filed Mar. 23, 2018, which is incorporated herein by reference.

The present application is also related to U.S. patent application Ser. No. 13/444,799, filed Apr. 11, 2012, now U.S. Pat. No. 8,913,698 issued Dec. 16, 2014 entitled "PROGRAMMABLE, FREQUENCY AGILE DIRECT CONVERSION DIGITAL RECEIVER WITH HIGH SPEED OVERSAMPLING."

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates generally to wireless communication systems, more specifically, to signal reception in a wireless communication system.

Description of the Related Art

Wireless systems are becoming a fundamental mode of communication in modern society. In order for wireless systems to continue to penetrate into the telecommunications market, the cost of providing the service must continue to decrease and the convenience of using the service should continue to increase. Several industry standard communication techniques have been developed based upon digital modulation schemes. For example, code division multiple access (CDMA), time division multiple access (TDMA) and frequency hopping techniques have been used to develop modern communication systems. As these systems are implemented in parallel with one another, it is often advantageous to have a receiver that is capable of communication using more than one of these standardized techniques. In order to do so, it is necessary to have a receiver that is capable of receiving signals which have been modulated according to several different modulation techniques.

Conventional receivers are implemented using double conversion receiver architectures. A double conversion receiver architecture is characterized in that the received radio frequency (RF) signal is converted to an intermediate frequency (IF) signal and the IF signal is subsequently converted to a baseband signal. In addition, gain control can also be applied at the IF. However, double conversion receivers have the disadvantage of utilizing a great number of circuit components, thereby, increasing the cost, size and power consumption of the receiver. An example of such a receiver is a superheterodyne receiver which uses frequency mixing or heterodyning to convert a received signal to a fixed IF signal, which can be more conveniently processed than the original radio carrier frequency.

Conventional analog receivers have traditionally used some variation of the superheterodyne approach generally consisting of an input coarse band selection filter, an amplifier stage, and one or more downconversion stages. The objective of the downconversion stage(s) is to translate the signal of interest into one or more intermediate frequencies, where the task of selecting the signal of interest (and rejecting other signals/noise) can be managed most efficiently given the limitations of passive filter technology. FIG. 1 discloses a representative block diagram of a typical superheterodyne receiver. Additional downconversion stages are often used to improve performance.

It is useful to perform downconversion using "in-phase" and "quadrature" versions of a local oscillator. Doing this has many advantages including avoiding an inherent drawback of superheterodyne architectures, namely that they tend (without input filtering) to work at two different input frequencies. I-Q reception tends to cancel out one of these images. A typical block diagram of a superheterodyne using the I-Q approach is shown in FIG. 2.

While superheterodyne receivers have achieved some limited level of sophistication with the advent of high speed analog-to-digital converter (ADC) technology, thus allowing the digital processing of the final IF output(s), the basic anatomy of the superheterodyne receiver has remained unchanged. Consequently the performance parameters of the receiver, specifically the ability to be tuned across a wide range of frequencies and the dynamic range, are limited by the behavior of the front end analog circuits.

An improvement to the conventional superheterodyne receiver is disclosed in "Direct Conversion Delta-Sigma Digital Receiver" (U.S. Pat. No. 6,748,025 to Hickling). In this architecture, frequency downconversion is integrated into the switching tree of a specialized delta-sigma converter, resulting in the ability to simultaneously downconvert an RF signal and quantize the resulting signal. A block diagram of the scheme for the "Direct Conversion Delta-Sigma Digital Receiver" is shown in FIGS. 3a-3b. FIG. 3a shows the configuration of a basic ADC front end, while FIG. 3b shows two front end circuits used together in an I-Q arrangement.

The "Direct Conversion Delta-Sigma Digital Receiver" represents a significant breakthrough in that it permits realization of a widely continuously tunable receiver front end, limited only by the available tuning range of the input clock signal. The circuit has been shown to have an input signal operating range between less than 100 MHz and greater than 6 GHz, with a dynamic range of slightly less than 60 dB.

The limitations of conventional superheterodyne receivers are generally understood in the art and include the need for a high resolution local oscillator (LO) due to the fact that the intermediate frequency must be placed precisely in the middle of the passband of a piezoelectric passive filter (crystal or SAW). Producing a synthesizer that is both widely tunable and simultaneously having low phase noise poses a fundamental challenge since the it necessitates that the loop have a large feedback divider ratio (and is consequently very "loose"—i.e., the rate at which it updates its phase error information and corrects the frequency of the voltage controlled oscillator (VCO) is very slow). Another limitation is the reliance on passive filter technology. Consequently, the user must make the choice to use a design that includes a very steep, fixed frequency filter, such as a typical IF filter, or must deal with "low Q" transfer functions in tunable filters. Unlike digital filter technology, the designer must choose between tunability and selectivity. Also, the front end designs of conventional superheterodyne receivers that are widely tunable are by necessity unwieldy because they require dividing the frequency range into bands and to use a completely different filter network for each band.

SUMMARY

The invention provides various embodiments of a wireless receiver, systems and methods of receiving a wireless signal. The invention is configured to be efficient, reliable, cost effective and can be arranged to provide a wireless receiver adapted to select desired signals and to reject undesired signals. The different embodiments comprise elements to implement a communication device capable of operating over a very wide range of frequencies using a highly integrated circuit. The elements can comprise many different devices arranged in different ways, with some devices comprising a plurality of digital filters and/or amplifiers.

In one embodiment, as broadly described herein, a wireless communications device is disclosed that comprises an architecture for a receiver front end that obviates the need for high order passive circuitry or RC active circuitry to select desired signals and to reject undesired signals. As a result of selectivity not being dependent on the fundamental physics of passive devices, much greater selectivity can be achieved without requiring external device technologies, such as Surface Acoustic Wave (SAW) filters, and multiple stages of frequency translation, which achieve selectivity at the expense of dynamic range due to the distortion incurred through multiple stages of analog processing. The architecture can further comprise a multipath architecture adapted to detect the phase and amplitude of a receive signal and further configured to utilize independently programmable waveforms for frequency translation and quantization.

These and other aspects and advantages of the invention will become apparent from the following detailed description and the accompanying drawings which illustrate by way of example the features of the invention.

DESCRIPTION OF THE DRAWINGS

FIG. 6a is a waveform of an N stage ring counter according to an embodiment of the invention;
FIG. 6b is a waveform of an N stage ring counter according to an embodiment of the invention.

FIG. 10a is a waveform of a predictive coder in operation according to an embodiment of the invention;
FIG. 10b is a waveform of a predictive coder in operation according to an embodiment of the invention.

Throughout this description, elements appearing in FIGS. are assigned three-digit reference designators, where the most significant digit is the FIG. number and the two least significant digits are specific to the element. An element that is not described in conjunction with a FIG. may be presumed to have the same characteristics and function as a previously-described element having a reference designator with the same least significant digits.

DETAILED DESCRIPTION

Description of Apparatus

The invention described herein is directed to different embodiments of a wireless communications device that can be used in many different applications, such as but not limited to a digital oversampling receiver adapted to select desired signals and to reject undesired signals.

Figure 4:
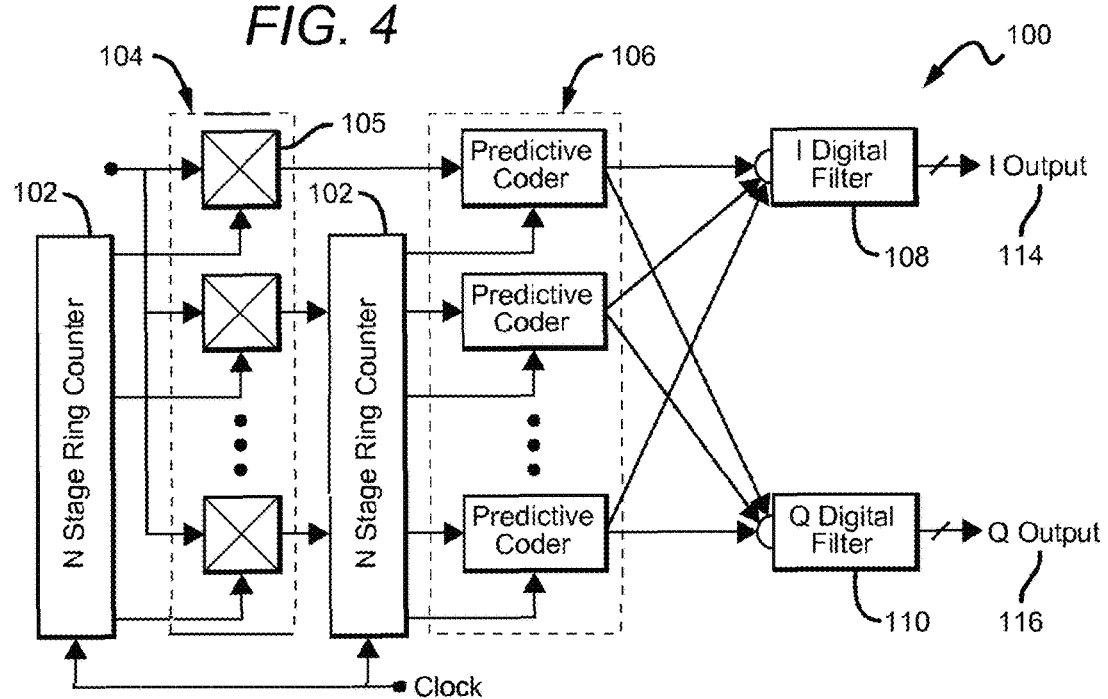
FIG. 4 is a block diagram of a wireless communications device according to an embodiment of the invention.

FIG. 4 is a block diagram showing a digital receiver 100 according to an embodiment of the invention. The architecture of the digital receiver 100 in FIG. 4 is capable of operating in several different modes. The digital receiver 100 of FIG. 4 comprises an N stage ring counter 102, N path switching network 104, predictive coders 106, an in-phase (I) digital filter 108 and a quadrature (Q) digital filter 110, wherein an RF input signal 112 is received by the receiver 100 such that the receiver 100 is adapted to process the RF input signal 112 and produce an I output signal 114 and a Q output signal 116.

Figure 5:
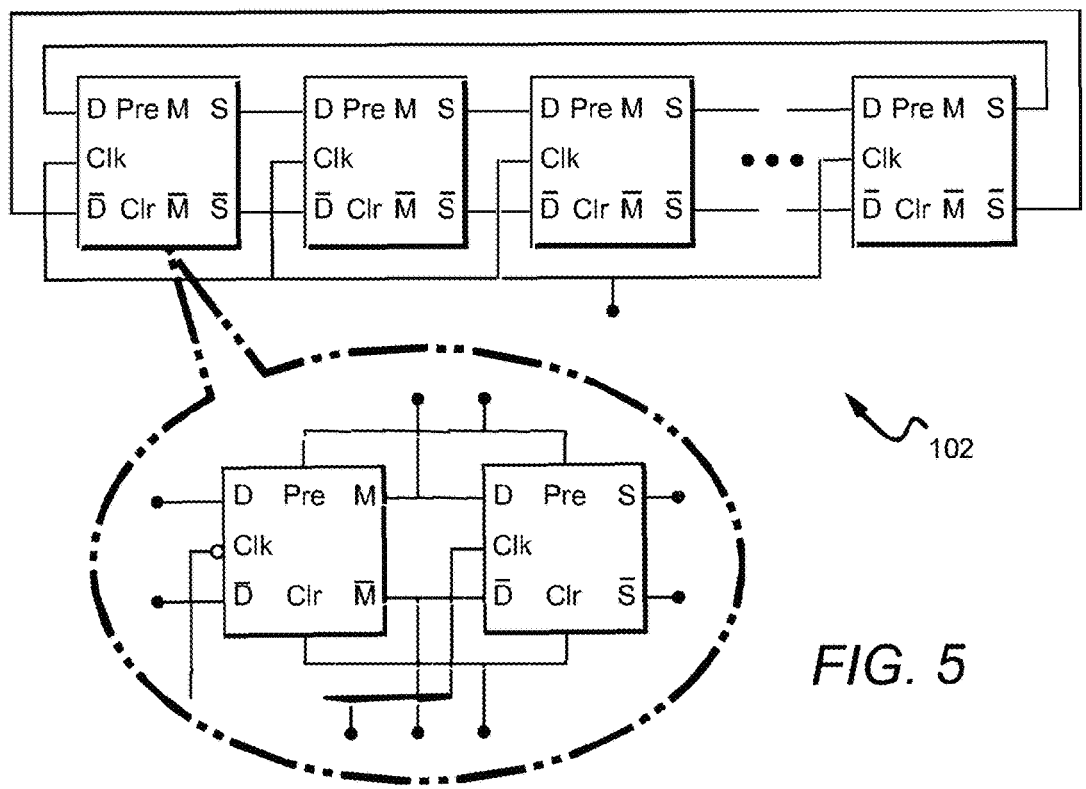
FIG. 5 is a block diagram of an N stage ring counter according to an embodiment of the invention.

The N stage ring counter 102 is configured to generate timing clock signals for the N path switching network 104 and the predictive coders 106. FIG. 5 discloses a block diagram of an embodiment of an N stage ring counter 102. The N stage ring counter 102 is designed using the maximum number of programmable stages for the counter, and a multiplexer is used to select which tap of the counter is fed back into the input. In an embodiment of the N stage ring counter 102, the outputs of both the master and slave stages of the master-slave flip-flops are used in order to permit half-clock cycle delays. The connections to the Preset (Pre) and Clear (Clr) inputs are not shown in FIG. 5, but are used to program the waveform to be conveyed by the counter 102. The programmability of the number of stages is implemented using a multiplexer (MUX) which directs which stage is selected to drive the first stage of the counter 102. In operation, the counter 102 would first be loaded asynchronously with the count pattern using the Preset and Clear inputs and then the counter 102 would be clocked, producing an N-cycle digital waveform. It should be noted, however, that since both master and slave outputs are monitored, an N-stage counter would have 2×N outputs, thus doubling the number of available phase outputs. Furthermore, this makes an N-cycle waveform capable of being realized using only N/2 stages, provided that the counter waveforms be restricted to those wherein logic state transitions only one per flip-flop clock cycle. This latter restriction effectively places the restriction that the output waveform having 1s and 0s sequentially occurring in pairs.

FIG. 6a discloses an example of a representative waveform of a five stage ring counter having a "10000" count sequence, while FIG. 6b discloses a six stage ring counter having a "111000" count sequence. Other embodiments having higher numbers of bits, two or more ring counters can be clocked in parallel to create multibit outputs to drive multibit N path switching networks 104.

The N path switching network 104 is configured to have the same number of stages as the first N stage ring counter 102 that drives the network. In an embodiment of the one bit configuration, the switching network 104 can be comprised of N current steering MUXes that take the input differential signal and either inverts its polarity or passes it unchanged (mathematically this amounts to multiplying the signal by ±1). In other embodiments, such as a "1.5 bit" configuration, two current steering MUXes are used to collectively permit the passing of the signal, inverting the signal, or suppressing the signal (multiplying by ±1 or 0). In other embodiments, the complexity of the switching network 104 can be extended to any number of bits through thermometric coding.

Figure 7A:
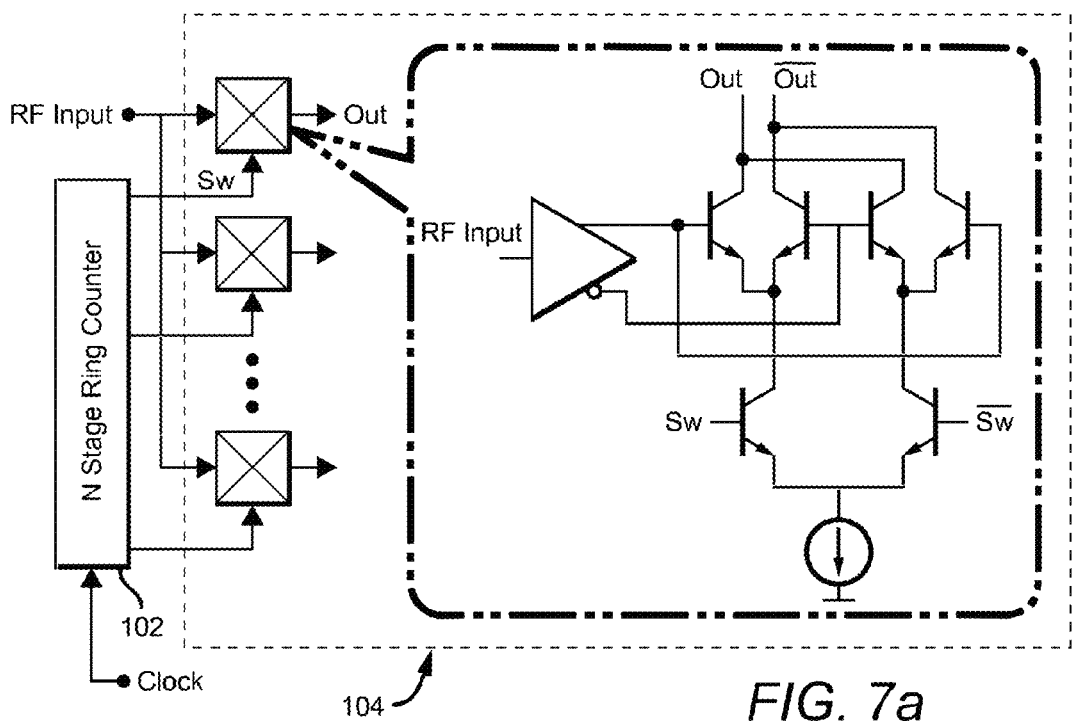
FIG. 7a is a block diagram of an N path switching network according to an embodiment of the invention.
Figure 7B:
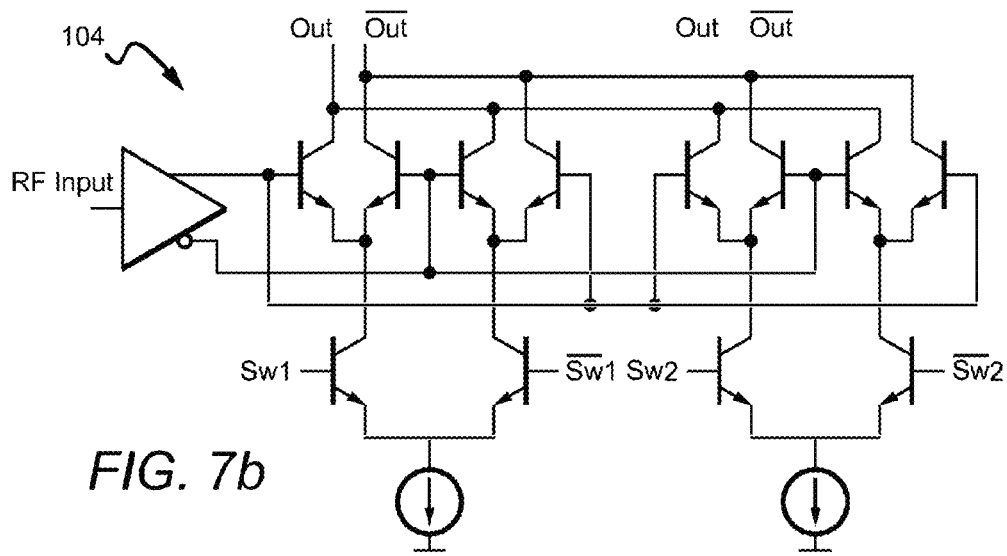
FIG. 7b is a block diagram of an N path switching network according to an embodiment of the invention.

An example of a schematic diagram of one path for the N path switching network 104 is shown in FIG. 7a, while FIG. 7b discloses a schematic diagram of a 1.5 bit version of the switching network 104. In the embodiment of FIG. 7a, each of the "Sw" inputs is driven by one output of the N stage ring counter 102. For the 1.5 bit system, switching signals are generated by simultaneously programming two separate ring counters 102 operating in synchrony. This approach to switching can be extended to M bits through the use of $2^M-1$ switches operating in parallel and a corresponding increase in the complexity of the ring counter, for example $2^M-1$ ring counters operating in parallel.

Figure 8:
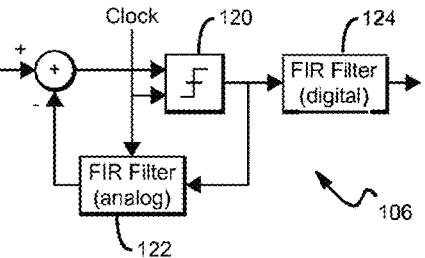
FIG. 8 is a block diagram of a predictive coder according to an embodiment of the invention.

Referring back to FIG. 4, the output of each of the switches 105 in the switching network 104 is arranged to be the input for a respective predictive coder 106, which serves as the front end of an oversampling analog-to-digital (A/D) converter. The output of the predictive coder 106 is then fed into a digital filter, which both suppresses the quantization noise and simultaneously converts the high speed serial data stream into a lower speed parallel data stream. A block diagram of the predictive coder 106 with the post filtering is shown in FIG. 8. In the embodiment of the predictive coder 106 of FIG. 8, the predictive coder 106 comprises a feedback loop including a quantizer 120 and a feedback analog finite impulse response (FIR) filter 122 which is configured to produce a high speed serial stream which contains the signal of interest along with quantization noise. A digital FIR filter 124 is configured to suppress the quantization noise and convert the high speed serial data stream into a lower speed parallel data stream.

At least one advantage of the invention is that the oversampling converter avoids the use of continuous time circuitry, which severely limits the maximum achievable effective number of bits (ENOB) because of the sensitivity to jitter. Furthermore, the invention exploits the inherent speed of differential current steering design technology and is therefore capable of operating at clock speeds in excess of 11 GHz. Yet another advantage of the invention is that the predictive coders 106 can be clocked using the same clock as the switching network 104, a multiple of the clocks, or a submultiple of the clocks used in the switching network discussed above. This programmable ratio is achieved by placing a repeating pattern in the ring counter to be operated at the multiple of the slower frequency.

Figure 9A:
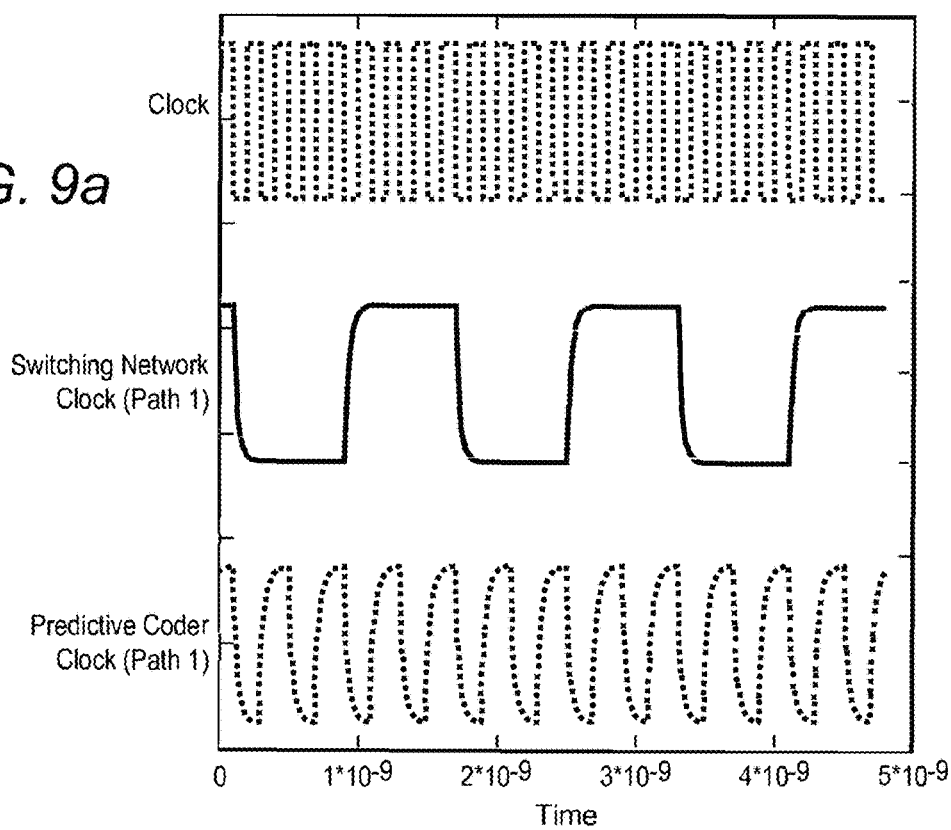
FIG. 9a is a waveform of a predictive coder in operation according to an embodiment of the invention.
Figure 9B:
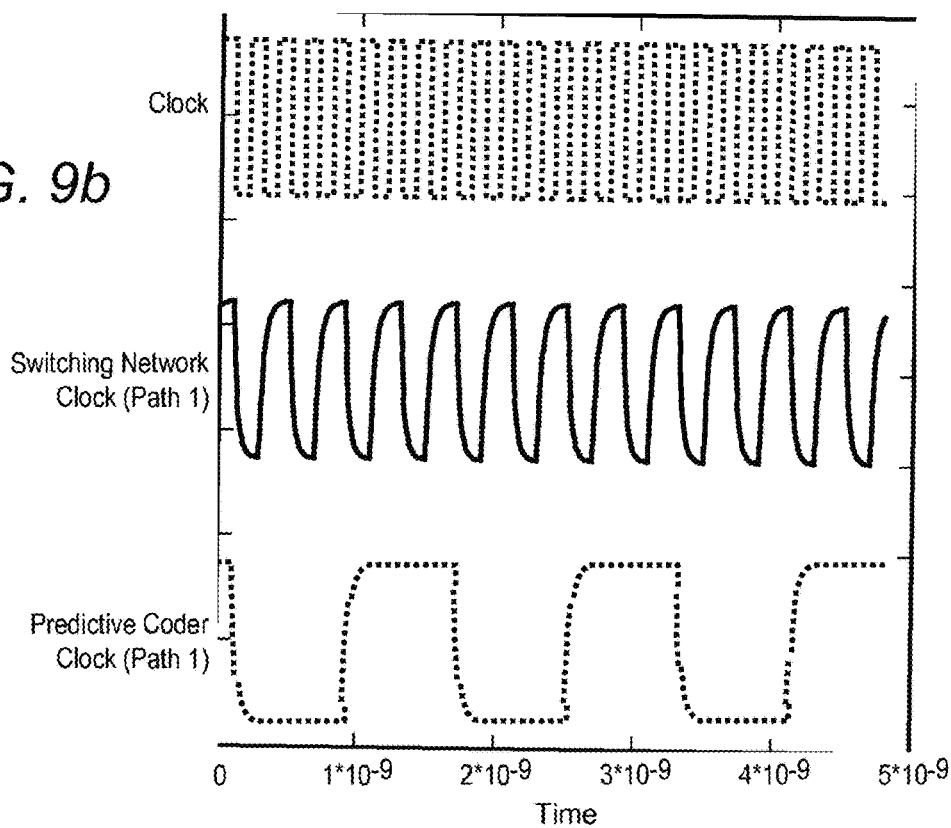
FIG. 9b is a waveform of a predictive coder in operation according to an embodiment of the invention.

FIGS. 9a and 9b are examples of timing diagrams of an embodiment of the predictive coder 106 while in operation, wherein the number of stages of the ring counters 102 is set to eight. In FIG. 9a, a "11110000" pattern is programmed into the switching path (an LO frequency of 5 GHz÷8=625 MHz). The predictive coder 106 is clocked using a "10101010" pattern (a clock frequency of 2.5 GHz). Note that in this configuration there are 16 separate phases (through the use of "master" and "slave" outputs from each of the flip-flops). In FIG. 9b, this situation is reversed and the LO is 2.5 GHz and the predictive coder clock is 625 MHz. Thus, the receiver can be programmed to accommodate relatively narrowband, high carrier frequency signals or relatively wideband, low carrier frequency signals through the appropriate programming of the ring counters. The number of stages and/or the pattern programmed into the switching path 104 and the predictive coder 106, as discussed above, are non-limiting examples and are not intended to limit the scope of the invention. In other embodiments, the ring counters 102 can have more or less than eight stages, while the pattern programmed into either the switching path 104 or the predictive coder 106 can be the same or different.

FIGS. 10a-10b disclose a numerical simulation of an embodiment of the predictive coder 106 while in operation. The clock frequency is normalized to 1 Hz and the resolution of the quantizer is one bit. In similar fashion to other feedback oversampling A/D converter engines, such as the delta-sigma converter, the overall resolution is given by the resolution of the quantizer 120 along with the frequency of the clock signal that is being fed into the predictive coder 106. If either the resolution of the quantizer 120 or the ratio of the clock frequency to the bandwidth of the input signal is increased, the resolution of the converter improves. FIG. 10a shows the time domain waveforms, with the original sine wave as a solid line, the predictive coder output (with incomplete filtering) is dotted, and the dashed waveform representing the transient error. FIG. 10b shows the Fast Fourier Transform (FFT) of the output, wherein the spectrum of an ideal sine wave is shown as a dotted line while the coder output is shown as a solid line.

In an embodiment of the invention, the N stage ring counter 102 that drives the N path switching network 104 is/are programmed with a simple 50% duty cycle waveform. However, in other embodiments, the N stage ring counter 102 and the N path switching network 104 can have a duty cycle waveform higher or lower than 50%, and is not intended to be limited to a simple 50% duty cycle waveform. In this embodiment, the N paths of the switching network 104 produce 2×N (because both "master" and "slave" outputs are used) time shifted (therefore phase shifted) versions of the LO waveform. Although the waveforms are square waves, because the effective LO frequency is so close to the incoming carrier frequency the frequency of the third and higher odd harmonics of the square wave are greatly separated from the fundamental. Thus the effect of these harmonics can be ignored and the system can be analyzed as if the LO signals are sine waves. By the very nature of the ring counter 102, the phases of these signals occur in 360°/2×N phase increments. For example, an eight stage counter 102 with a "11110000" waveform would produce sixteen outputs separated in phase increments of 22.5°. These multiple outputs can be trigonometrically combined to produce conventional I-Q outputs as will be described herein.

Figure 11:
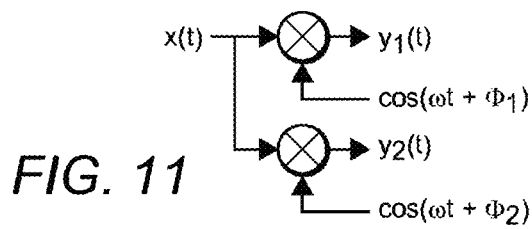
FIG. 11 is a block diagram of a wireless communications device according to an embodiment of the invention.

The underlying theory of operation for the receiver 100 is that the amplitude and phase information of any incoming waveform can be uniquely extracted from the incoming waveform using two sine waves with any arbitrary phase difference between them. Although the usual case prescribes that the two signals be in perfect phase quadrature (i.e., 90° out of phase with each other), any two arbitrary phases can be used as long as they are not in perfect phase alignment or 180° out of phase with one another. FIG. 11 discloses a block diagram of such a system, which we will now proceed to analyze.

Since amplitude and phase information can be extracted using any two arbitrary phases, it then necessarily follows that it should be possible to use trigonometric identities to generate the waveforms that would result from the use of waveforms in true quadrature. Let us assume, for example, then that the incoming waveform is one that has been modulated using conventional quadrature modulation, that is $$x(t)=I(t)\cos \omega t+Q(t)\sin \omega t$$

If we mix this signal (or equivalently multiply it) with a signal $\cos(\omega t+\phi_1)$, the mathematical expression for the resulting waveform is as follows:

$$\begin{aligned}y_1(t) &= x(t)[\cos(\omega t + \phi_1)] \\ &= x(t)[\cos \omega t \cos \phi_1 - \sin \omega t \sin \phi_1] \\ &= [I(t)\cos \omega t + Q(t)\sin \omega t][\cos \omega t \cos \phi_1 - \sin \omega t \sin \phi_1] \\ &= I(t)\cos \phi_1 \cos^2 \omega t + Q(t)\cos \phi_1 \sin \omega t \cos \omega t - \\ &\quad I(t)\sin \phi_1 \sin \omega t \cos \omega t - Q(t)\sin \phi_1 \sin^2 \omega t \\ &= \frac{I(t)}{2}\cos \phi_1(1+\cos 2\omega t) + \frac{Q(t)}{2}\cos \phi_1 \sin 2\omega t - \\ &\quad \frac{I(t)}{2}\sin \phi_1 \sin 2\omega t - \frac{Q(t)}{2}\sin \phi_1(1-\cos 2\omega t)\end{aligned}$$

Note that the above waveform contains both baseband (or "DC") components as well as components that are spectrally centered about twice the carrier frequency. Since the phase and amplitude information is contained in the baseband components, we can discard the higher frequency components by lowpass filtering to reject the components centered about twice the carrier frequency:

$$y_1^{BB}(t) = \frac{I(t)}{2}\cos \phi_1 - \frac{Q(t)}{2}\sin \phi_1,$$

The superscript "BB" represents just the baseband component (or amplitude and phase information) for the signal under consideration. It also follows that if a second signal (with a phase $\phi_2$) is additionally mixed with the incoming signal, the resulting baseband waveform would be:

$$y_2^{BB}(t) = \frac{I(t)}{2}\cos \phi_2 - \frac{Q(t)}{2}\sin \phi_2$$

These two equations can be arranged in matrix form and used to solve for I(t) and Q(t) in terms of the baseband waveforms $y_1^{BB}(t)$ and $y_2^{BB}(t)$.

$$\begin{bmatrix}\frac{\cos \phi_1}{2} & -\frac{\sin \phi_1}{2} \\ \frac{\cos \phi_2}{2} & -\frac{\sin \phi_2}{2}\end{bmatrix}\begin{bmatrix}I(t) \\ Q(t)\end{bmatrix} = \begin{bmatrix}y_1^{BB}(t) \\ y_2^{BB}(t)\end{bmatrix}$$

Solving for $I(t), Q(t)$ $$I(t) = \frac{-2\sin \phi_2 y_1^{BB}(t) + 2\sin \phi_1 y_2^{BB}(t)}{-\sin \phi_2 \cos \phi_1 + \sin \phi_1 \cos \phi_2} = \frac{2\sin \phi_2 y_1^{BB}(t) - 2\sin \phi_1 y_2^{BB}(t)}{\sin(\phi_2 - \phi_1)}$$

$$Q(t) = \frac{2\cos \phi_1 y_2^{BB}(t) - 2\cos \phi_2 y_1^{BB}(t)}{-\sin \phi_2 \cos \phi_1 + \sin \phi_1 \cos \phi_2} = \frac{2\cos \phi_2 y_1^{BB}(t) - 2\cos \phi_1 y_2^{BB}(t)}{\sin(\phi_2 - \phi_1)}$$

Since this embodiment of the N path system generates projections from N different phases of the LO it would follow that N−2 of these phases are redundant to generate the amplitude and phase information from the incoming signal of interest. Yet these redundant signals can be advantageously used to improve the detection of the amplitude and phase of the incoming signal, resulting in a signal processing gain and commensurate improvement in signal-to-noise ratio (SNR). However, the challenge in using these N outputs is to accomplish the following:

1. Choose pairs of outputs from which "estimates" of I(t) and Q(t) can be computed. These estimates are then added together (effectively averaging them together times a scaling factor).
2. Since there is no "canonical" way of choosing such pairs we must establish some reasonable criteria in choosing such pairs:
    a. Every phase will appear in the same number of pairs as every other phase. This keeps the estimates of I(t) and Q(t) from "favoring" one or more particular phases.
    b. Each of the pairs must be chosen in such a way as to ensure that $(\phi_2-\phi_1)$ will never be 0° or 180°.
    c. To the extent possible, it is important to ensure that the angle between the two phases ($\phi_2$ and $\phi_1$) is large enough so that the values of coefficients are not excessively large or small.

Figure 12:
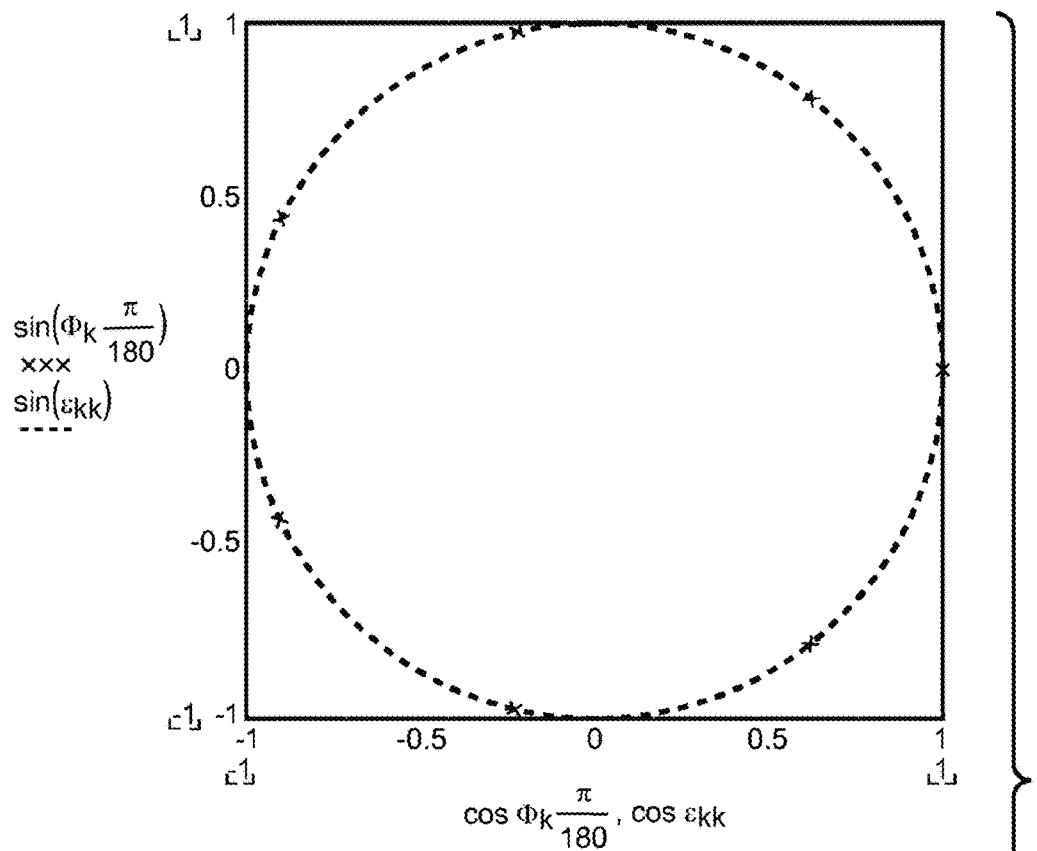
FIG. 12 is an example of a phase pairing scheme according to an embodiment of the invention.
Figure 12:
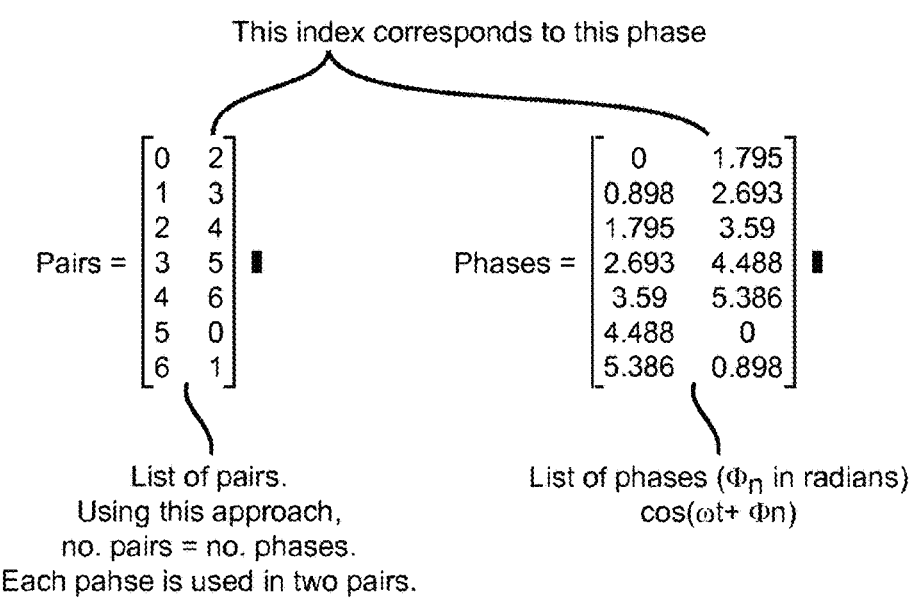

At least one methodology for choosing these pairs that satisfies these criteria is to pair off every other phase (i.e., 0 and 2, 1 and 3, 2 and 4, 3 and 5, etc.) so that N pairs are formed. This methodology satisfies all three criteria above provided that N is not excessively large. For example if N=128, then the angle between pairs would be 5.625°, which has a sine of 0.098. An example of how this pairing scheme is implemented, wherein Phase k is paired with Phase k+2 and N=7 is shown in FIG. 12.

Once the pairs are chosen, the equations for I(t) and Q(t) in terms of $y_1^{BB}(t)$ and $y_2^{BB}(t)$ are used to compute the necessary coefficients to multiply $y_1^{BB}(t)$ and $y_2^{BB}(t)$. For an N path architecture, there are N pairs of phases, which each produce an estimate of I(t) and Q(t). When these N estimates of I(t) and Q(t) are added together, the net effect is that the N estimates are averaged (with a scaling factor), resulting in a processing gain as stated earlier. The results of a Monte Carlo simulation showing the effect processing gain is shown in Table 1.

TABLE 1

| N | Gain Err. [dB] | Phase Err. [°] |
|---|---|---|
| 8 | 0.512 | 2.561 |
| 12 | 0.447 | 2.034 |
| 16 | 0.368 | 2.009 |
| 24 | 0.339 | 1.555 |
| 32 | 0.326 | 1.6 |
| 64 | 0.189 | 1.044 |

Each path was simulated with a uniformly distributed random gain error of ±1 dB and phase error of ±10°. As the number of paths (N) increases, the overall gain and phase error of the recovered I and Q information improves, showing the effect of this processing gain.

The architecture of the invention is ideal for implementation as a highly integrated circuit. Digital filters are not prone to the lot-to-lot variations of passive devices, obviating the need for complex architectures to compensate for these variations in inductor and capacitor values. Since conversion to digital is done in functionally the first stage of the receiver, the receiver is less prone to distortion and therefore is capable of much greater dynamic range performance than a conventional analog architecture.

The invention disclosed herein is an improvement over conventional receivers, in particular, the multipath architecture permits more accurate detection of the phase and amplitude of a received signal, thereby achieving far better signal to noise ratio (SNR) relative to it. In addition, by using independently programmable waveforms for frequency translation and quantization, the invention provides a user much greater flexibility programming the desired bandwidth and carrier frequency of the receiver independently. In contrast, U.S. Pat. No. 6,748,025 could only achieve a bandwidth that scales with carrier frequency.

Lastly, all of the above makes it possible to implement a communication device capable of operating over a very wide range of frequencies using a highly integrated circuit without the need to reprogram the circuit using external passive components (referred to as frequency agility). While previous architectures have claimed such agility, they have generally required the use of external passive devices and/or have achieved such agility at the expense of receiver performance.

Although the invention has been described in considerable detail with reference to certain configurations thereof, other versions are possible, such that the invention may be embodied in other specific forms without departing from its spirit or essential characteristics.

In the preceding discussion, the derivation of the N (N being the number of phases or paths) I(t) and Q(t) estimates was based on the computation of coefficients for N non-quadrature decompositions of an incoming signal. Noting, however, that each of the N phases appears twice in the list of decompositions (once as the first phase in a pair and once as the second phase), it is possible then to compute the coefficients corresponding to the $k^{th}$ phase directly without having to form the pairs referred to in the discussion above. Thus an alternate realization is possible utilizing half as many coefficients (N of them to be exact) as the preceding discussion (which requires the addition of 2N terms). Reviewing the equations derived above:

$$I(t) = \frac{-2\sin\phi_2 y_1^{BB}(t) + 2\sin\phi_1 y_2^{BB}(t)}{-\sin\phi_2\cos\phi_1 + \sin\phi_1\cos\phi_2} = \frac{2\sin\phi_2 y_1^{BB}(t) - 2\sin\phi_1 y_2^{BB}(t)}{\sin(\phi_2-\phi_1)}$$

$$Q(t) = \frac{2\cos\phi_2 y_1^{BB}(t) - 2\cos\phi_1 y_2^{BB}(t)}{-\sin\phi_2\cos\phi_1 + \sin\phi_1\cos\phi_2} = \frac{2\cos\phi_1 y_2^{BB}(t) - 2\cos\phi_2 y_1^{BB}(t)}{\sin(\phi_2-\phi_1)}$$

We can rewrite these as:

$$I(t)=C_1^I y_1^{BB}(t)+C_2^I y_2^{BB}(t)$$

$$Q(t)=C_1^Q y_1^{BB}(t)+C_2^Q y_2^{BB}(t)$$

where:

$$C_1^I = \frac{2\sin\phi_2}{\sin(\phi_2-\phi_1)}$$

$$C_2^I = \frac{-2\sin\phi_1}{\sin(\phi_2-\phi_1)}$$

$$C_1^Q = \frac{2\cos\phi_2}{\sin(\phi_2-\phi_1)}$$

$$C_2^Q = \frac{-2\cos\phi_1}{\sin(\phi_2-\phi_1)}$$

(Note that the definitions of $\phi_1$ and $\phi_2$ are different between the first and third equations versus the second and fourth equations. A particular phase (say, k) will appear as $\phi_1$ in the first and third equations and as $\phi_2$ in the second and fourth equations.

In the N=7 example previously introduced, Phase 0 appears in the list as the first term in the first pair and as the second term in the sixth pair (see FIG. 12). Since the results of each of the pair is combined to form the overall estimates for I(t) and Q(t), we can combine the contributions of Phase 0 in the first and sixth terms directly and establish the overall coefficient corresponding to Phase 0 without having to form pairs. In the first equation, Phase 0 is combined with Phase $$2 \cdot \frac{2\pi}{7}$$

(with Phase 0 appearing as $\phi_1$) and in the sixth equation, Phase 0 is combined with Phase $$5 \cdot \frac{2\pi}{7}$$

(with Phase 0 appearing as $\phi_2$). Thus we can combine the $C_1^I$ and $C_1^Q$ from the first equations with the $C_2^I$ and $C_2^Q$ from the second equations to tabulate an overall coefficient representing the total contribution of Phase 0 to I(t) and Q(t) outputs of the N paths:

$$K_0^I = \frac{2\sin\left(2 \cdot \frac{2\pi}{7}\right)}{\sin\left(2 \cdot \frac{2\pi}{7}\right)} - \frac{2\sin\left(5 \cdot \frac{2\pi}{7}\right)}{\sin\left(2 \cdot \frac{2\pi}{7}\right)} = 2$$

$$K_0^Q = \frac{2\cos\left(2 \cdot \frac{2\pi}{7}\right)}{\sin\left(2 \cdot \frac{2\pi}{7}\right)} - \frac{2\cos\left(5 \cdot \frac{2\pi}{7}\right)}{\sin\left(2 \cdot \frac{2\pi}{7}\right)} = 0$$

Even though this is a trivial example (it is not a surprise that Phase 0 would have complete contribution to the cosine term and no contribution to the sine term since Phase 0 is itself identical to the cosine term), we can generalize the above to the $k^{th}$ phase of N total phases:

$$K_k^I = \frac{2\sin\left[(k+2) \cdot \frac{2\pi}{N}\right]}{\sin\left(\frac{4\pi}{N}\right)} - \frac{2\sin\left[(k-2) \cdot \frac{2\pi}{N}\right]}{\sin\left(\frac{4\pi}{N}\right)} =$$

$$\frac{4\cos\left(\frac{2\pi k}{N}\right)\sin\left(\frac{4\pi}{N}\right)}{\sin\left(\frac{4\pi}{N}\right)} = 4\cos\left(\frac{2\pi k}{N}\right)$$

$$K_k^Q = \frac{2\cos\left[(k+2) \cdot \frac{2\pi}{N}\right]}{\sin\left(\frac{4\pi}{N}\right)} - \frac{2\cos\left[(k-2) \cdot \frac{2\pi}{N}\right]}{\sin\left(\frac{4\pi}{N}\right)} =$$

$$-\frac{4\sin\left(\frac{2\pi k}{N}\right)\sin\left(\frac{4\pi}{N}\right)}{\sin\left(\frac{4\pi}{N}\right)} = -4\sin\left(\frac{2\pi k}{N}\right)$$

where:
k=0 . . . N−1

Of course, since the "4" is a scaling factor, it can be dropped from both coefficients yielding a fairly simple result. The implication of this result is that the coefficients corresponding to each of the oversampling converter outputs can be computed without using intermediate pairs.

In the preceding discussion, the derivation of the N (N being the number of phases or paths) I(t) and Q(t) estimates was based on the computation of coefficients for N non-quadrature decompositions of an incoming signal. Noting, however, that each of the N phases appears twice in the list of decompositions (once as the first phase in a pair and once as the second phase), it is possible then to compute the coefficients corresponding to the $k^{th}$ phase directly without having to form the pairs referred to in the discussion above. Thus an alternate realization is possible utilizing half as many coefficients (N of them to be exact) as the preceding discussion (which requires the addition of 2N terms). Reviewing the equations derived above:

$$I(t) = \frac{-2\sin\phi_2 y_1^{BB}(t) + 2\sin\phi_2 y_1^{BB}(t) - 2\sin\phi_1 y_2^{BB}(t)}{-\sin\phi_2 \cos\phi_1 + \sin\phi_1 \cos\phi_2} = \frac{2\sin\phi_1 y_2^{BB}(t)}{\sin(\phi_2 - \phi_1)}$$

$$Q(t) = \frac{2\cos\phi_1 y_2^{BB}(t) - 2\cos\phi_2 y_1^{BB}(t) - 2\cos\phi_2 y_1^{BB}(t)}{-\sin\phi_2 \cos\phi_1 + \sin\phi_1 \cos\phi_2} = \frac{2\cos\phi_1 y_2^{BB}(t)}{\sin(\phi_2 - \phi_1)}$$

We can rewrite these as:

$$I(t) = C_1^I y_1^{BB}(t) + C_2^I y_2^{BB}(t)$$

$$Q(t) = C_1^Q y_1^{BB}(t) + C_2^Q y_2^{BB}(t)$$

where:

$$C_1^I = \frac{2\sin\phi_2}{\sin(\phi_2 - \phi_1)}$$

$$C_2^I = \frac{-2\sin\phi_1}{\sin(\phi_2 - \phi_1)}$$

$$C_1^Q = \frac{2\cos\phi_2}{\sin(\phi_2 - \phi_1)}$$

$$C_2^Q = \frac{-2\cos\phi_1}{\sin(\phi_2 - \phi_1)}$$

(Note that the definitions of $\phi_1$ and $\phi_2$ are different between the first and third equations versus the second and fourth equations. A particular phase (say, k) will appear as $\phi_1$ in the first and third equations and as $\phi_2$ in the second and fourth equations.

In the N=7 example previously introduced, Phase 0 appears in the list as the first term in the first pair and as the second term in the sixth pair (see FIG. 12). Since the results of each of the pair is combined to form the overall estimates for I(t) and Q(t), we can combine the contributions of Phase 0 in the first and sixth terms directly and establish the overall coefficient corresponding to Phase 0 without having to form pairs. In the first equation, Phase 0 is combined with Phase $$2 \cdot \frac{2\pi}{7}$$

(with Phase 0 appearing as $\phi_1$) and in the sixth equation, Phase 0 is combined with Phase $$5 \cdot \frac{2\pi}{7}$$

(with Phase 0 appearing as $\phi_2$). Thus we can combine the $C_1^I$ and $C_1^Q$ from the first equations with the $C_2^I$ and $C_2^Q$ from the second equations to tabulate an overall coefficient representing the total contribution of Phase 0 to I(t) and Q(t) outputs of the N paths:

$$K_0^I = \frac{2\sin\left(2 \cdot \frac{2\pi}{7}\right)}{\sin\left(2 \cdot \frac{2\pi}{7}\right)} - \frac{2\sin\left(5 \cdot \frac{2\pi}{7}\right)}{\sin\left(2 \cdot \frac{2\pi}{7}\right)} = 2$$

$$K_0^Q = \frac{2\cos\left(2 \cdot \frac{2\pi}{7}\right)}{\sin\left(2 \cdot \frac{2\pi}{7}\right)} - \frac{2\cos\left(5 \cdot \frac{2\pi}{7}\right)}{\sin\left(2 \cdot \frac{2\pi}{7}\right)} = 0$$

Even though this is a trivial example (it is not a surprise that Phase 0 would have complete contribution to the cosine term and no contribution to the sine term since Phase 0 is itself identical to the cosine term), we can generalize the above to the $k^{th}$ phase of N total phases:

$$K_k^I = \frac{2\sin\left[(k+2) \cdot \frac{2\pi}{N}\right]}{\sin\left(\frac{4\pi}{N}\right)} - \frac{2\sin\left[(k-2) \cdot \frac{2\pi}{N}\right]}{\sin\left(\frac{4\pi}{N}\right)} =$$

$$\frac{4\cos\left(\frac{2\pi k}{N}\right)\sin\left(\frac{4\pi}{N}\right)}{\sin\left(\frac{4\pi}{N}\right)} = 4\cos\left(\frac{2\pi k}{N}\right)$$

$$K_k^Q = \frac{2\cos\left[(k+2) \cdot \frac{2\pi}{N}\right]}{\sin\left(\frac{4\pi}{N}\right)} - \frac{2\cos\left[(k-2) \cdot \frac{2\pi}{N}\right]}{\sin\left(\frac{4\pi}{N}\right)} =$$

$$-\frac{4\sin\left(\frac{2\pi k}{N}\right)\sin\left(\frac{4\pi}{N}\right)}{\sin\left(\frac{4\pi}{N}\right)} = -4\sin\left(\frac{2\pi k}{N}\right)$$

where:
k=0 . . . N−1

Of course, since the "4" is a scaling factor, it can be dropped from both coefficients yielding a fairly simple result. The implication of this result is that the coefficients corresponding to each of the oversampling converter outputs can be computed without using intermediate pairs.

In the preceding discussion, the derivation of the N (N being the number of phases or paths) I(t) and Q(t) estimates was based on the computation of coefficients for N non-quadrature decompositions of an incoming signal. Noting, however, that each of the N phases appears twice in the list of decompositions (once as the first phase in a pair and once as the second phase), it is possible then to compute the coefficients corresponding to the $k^{th}$ phase directly without having to form the pairs referred to in the discussion above. Thus an alternate realization is possible utilizing half as many coefficients (N of them to be exact) as the preceding discussion (which requires the addition of 2N terms). Reviewing the equations derived above:

$$I(t) = \frac{-2\sin\phi_2 y_1^{BB}(t) + 2\sin\phi_1 y_2^{BB}(t)}{-\sin\phi_2 \cos\phi_1 + \sin\phi_1 \cos\phi_2} = \frac{2\sin\phi_2 y_1^{BB}(t) - 2\sin\phi_1 y_2^{BB}(t)}{\sin(\phi_2 - \phi_1)}$$

$$Q(t) = \frac{2\cos\phi_1 y_2^{BB}(t) - 2\cos\phi_2 y_1^{BB}(t)}{-\sin\phi_2 \cos\phi_1 + \sin\phi_1 \cos\phi_2} = \frac{2\cos\phi_2 y_1^{BB}(t) - 2\cos\phi_1 y_2^{BB}(t)}{\sin(\phi_2 - \phi_1)}$$

We can rewrite these as:

$$I(t) = C_1^I y_1^{BB}(t) + C_2^I y_2^{BB}(t)$$

$$Q(t) = C_1^Q y_1^{BB}(t) + C_2^Q y_2^{BB}(t)$$

where:

$$C_1^I = \frac{2\sin\phi_2}{\sin(\phi_2 - \phi_1)}$$

$$C_2^I = \frac{-2\sin\phi_1}{\sin(\phi_2 - \phi_1)}$$

$$C_1^Q = \frac{2\cos\phi_2}{\sin(\phi_2 - \phi_1)}$$

$$C_2^Q = \frac{-2\cos\phi_1}{\sin(\phi_2 - \phi_1)}$$

(Note that the definitions of $\phi_1$ and $\phi_2$ are different between the first and third equations versus the second and fourth equations. A particular phase (say, k) will appear as $\phi_1$ in the first and third equations and as $\phi_2$ in the second and fourth equations.

In the N=7 example previously introduced, Phase 0 appears in the list as the first term in the first pair and as the second term in the sixth pair (see FIG. 12). Since the results of each of the pair is combined to form the overall estimates for I(t) and Q(t), we can combine the contributions of Phase 0 in the first and sixth terms directly and establish the overall coefficient corresponding to Phase 0 without having to form pairs. In the first equation, Phase 0 is combined with Phase $$2 \cdot \frac{2\pi}{7}$$

(with Phase 0 appearing as $\phi_1$) and in the sixth equation, Phase 0 is combined with Phase $$5 \cdot \frac{2\pi}{7}$$

(with Phase 0 appearing as $\phi_2$). Thus we can combine the $C_1^I$ and $C_1^Q$ from the first equations with the $C_2^I$ and $C_2^Q$ from the second equations to tabulate an overall coefficient representing the total contribution of Phase 0 to I(t) and Q(t) outputs of the N paths:

$$K_0^I = \frac{2\sin\left(2 \cdot \frac{2\pi}{7}\right)}{\sin\left(2 \cdot \frac{2\pi}{7}\right)} - \frac{2\sin\left(5 \cdot \frac{2\pi}{7}\right)}{\sin\left(2 \cdot \frac{2\pi}{7}\right)} = 2$$

$$K_0^Q = \frac{2\cos\left(2 \cdot \frac{2\pi}{7}\right)}{\sin\left(2 \cdot \frac{2\pi}{7}\right)} - \frac{2\cos\left(5 \cdot \frac{2\pi}{7}\right)}{\sin\left(2 \cdot \frac{2\pi}{7}\right)} = 0$$

Even though this is a trivial example (it is not a surprise that Phase 0 would have complete contribution to the cosine term and no contribution to the sine term since Phase 0 is itself identical to the cosine term), we can generalize the above to the $k^{th}$ phase of N total phases:

$$K_k^I = \frac{2\sin\left[(k+2) \cdot \frac{2\pi}{N}\right]}{\sin\left(\frac{4\pi}{N}\right)} - \frac{2\sin\left[(k-2) \cdot \frac{2\pi}{N}\right]}{\sin\left(\frac{4\pi}{N}\right)} =$$

$$\frac{4\cos\left(\frac{2\pi k}{N}\right)\sin\left(\frac{4\pi}{N}\right)}{\sin\left(\frac{4\pi}{N}\right)} = 4\cos\left(\frac{2\pi k}{N}\right)$$

$$K_k^Q = \frac{2\cos\left[(k+2)\cdot\frac{2\pi}{N}\right]}{\sin\left(\frac{4\pi}{N}\right)} - \frac{2\cos\left[(k-2)\cdot\frac{2\pi}{N}\right]}{\sin\left(\frac{4\pi}{N}\right)} =$$

$$-\frac{4\sin\left(\frac{2\pi k}{N}\right)\sin\left(\frac{4\pi}{N}\right)}{\sin\left(\frac{4\pi}{N}\right)} = -4\sin\left(\frac{2\pi k}{N}\right)$$

where:

k=0 . . . N−1

Of course, since the "4" is a scaling factor, it can be dropped from both coefficients yielding a fairly simple result. The implication of this result is that the coefficients corresponding to each of the oversampling converter outputs can be computed without using intermediate pairs.

Figure 1:
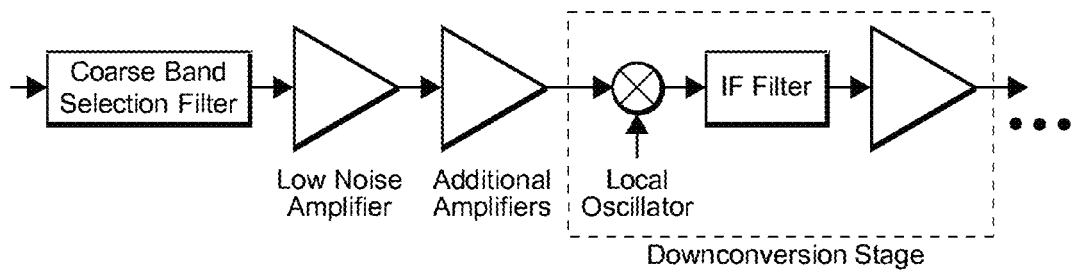
FIG. 1 is a block diagram of a prior art receiver.
Figure 2:
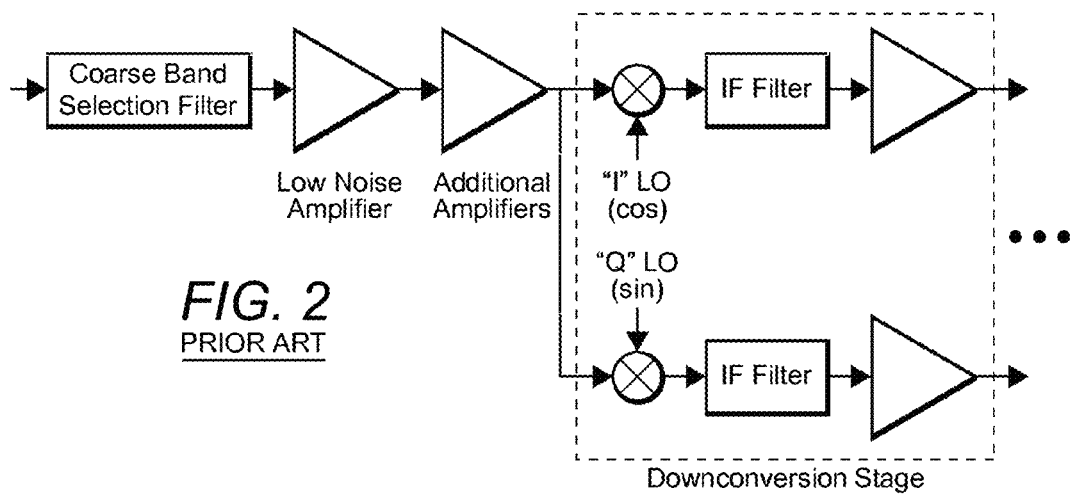
FIG. 2 is a block diagram of a prior art receiver.
Figure 3A:
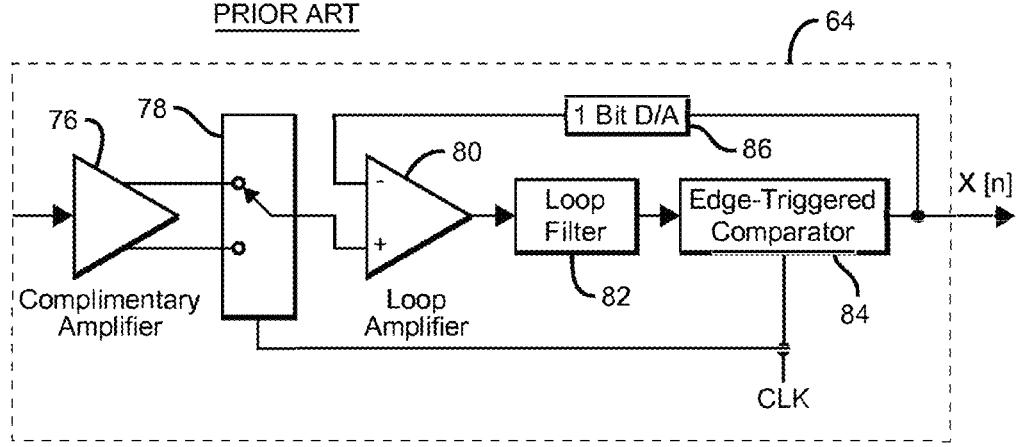
FIG. 3a is a block diagram of a prior art Analog-to-Digital front end.
Figure 3B:
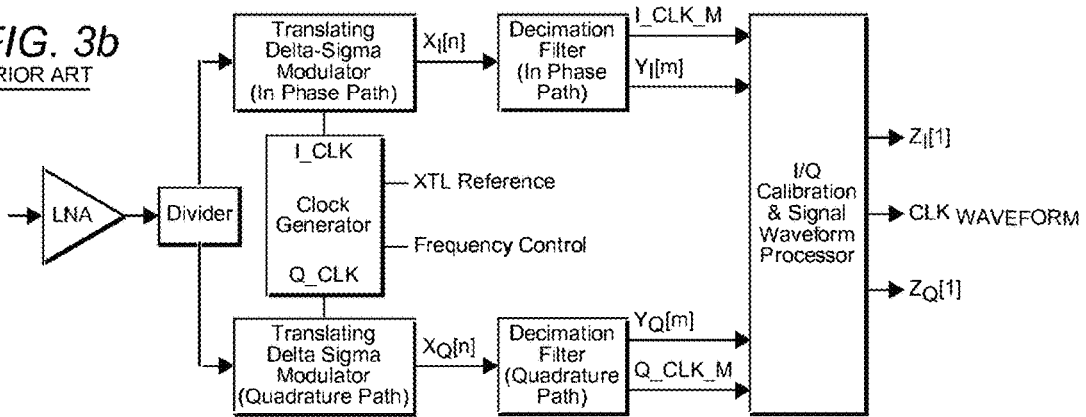
FIG. 3b is a block diagram of a prior art receiver.

The most common method of demodulating signals that are modulated using phase shift keying (i.e., signals in which digital information is encoded by selecting one of M phases of the carrier to convey $\log_2$ (M) bits of data per symbol), is to compare the magnitude (i.e., amplitude) and sign of the I and Q outputs of a conventional demodulator (see FIG. 2). Assuming that a coherent timing signal can be recovered from the incoming signal (or otherwise generated from a common time base shared between the transmitter and receiver). This method is highly effective for low values of M (for example binary phase shift keying (BPSK) where M=2 or quaternary phase shift keying (QPSK) where M=4), since each of the I and Q outputs need only be distinguished between two possible values, which can be done using low precision analog circuits. Theoretically it can be extended to larger values of M, but such a system would require that each of I and Q outputs be resolved into one of multiple values (for example I and Q take on five possible values for M=8). This places great demands on the performance of the analog circuits in I/Q receivers.

Figure 13:
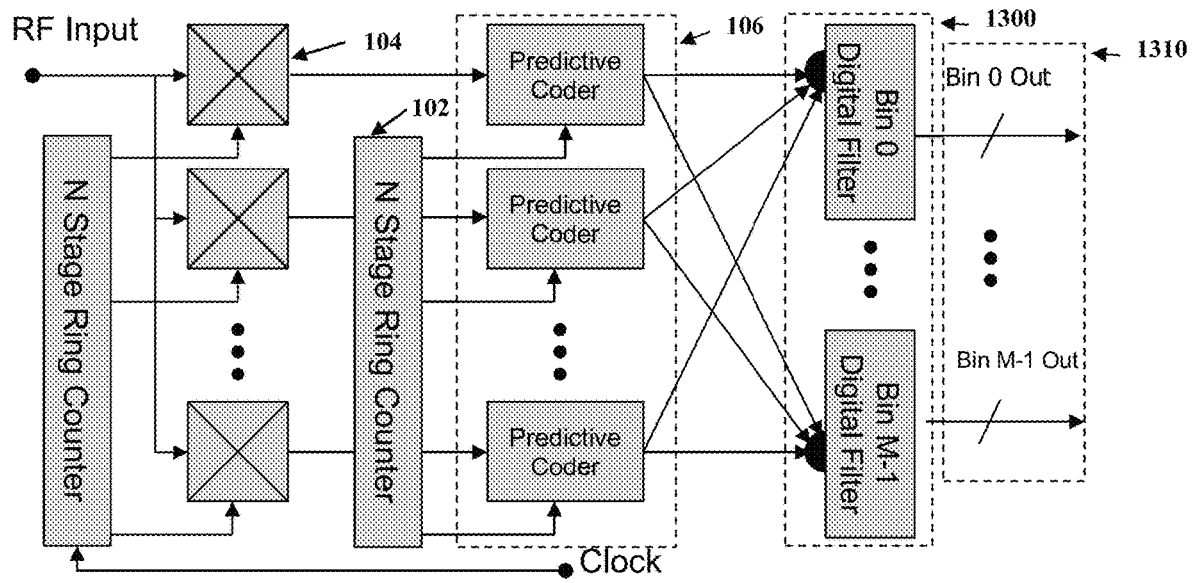
FIG. 13 is a block diagram of a wireless communications device having M digital filters according to an embodiment of the invention.

A more direct method of placing the input signal into M phase "bins" can be developed by exploiting the improved amplitude and timing resolution afforded by the front end of the architecture of FIG. 4. Rather than using two digital filters back end of the receiver to produce I and Q outputs, M digital filters are used to evaluate the "maximum likelihood" of the input signal phase falling within one of the M phase bins. A block diagram of such a scheme is shown in FIG. 13. FIG. 13 may be a block diagram of an M-ary PSK demodulator based on the digital receiver architecture of this disclosure where the number of switching network paths would be N while the number of phase bins would be M. In one case, FIG. 13 may be similar to FIG. 4 but where the outputs of M digital filters (M, a number greater than two) each represent one phase state of a phase-shift keyed wireless transmission with M possible phase states.

In FIG. 13, the front end of the receiver is as previously shown in FIG. 4, with a wireless transmission driving the input of an N path switching network 104 and culminating in N outputs from predictive coders 106. But rather than using two digital filters (108, 110) to produce I and Q outputs (114, 116) per FIG. 4, in FIG. 13, a collection of M digital filters 1300 is used to combine the outputs of the predictive coders 106 to produce a collection of M outputs 1310 (labeled "Bin 0 Out" through "Bin M−1 Out" in FIG. 13). Here, "Bin 0" is prescribed to correspond to a phase of zero while "Bin M−1" is prescribed to represent a phase of $2\pi$ (M−1)/M. Ideally, only one of the M outputs would be non-zero and indicate the phase of the incoming wireless transmission. In practice, the corresponding bin would have the largest output while some adjacent bins may have smaller (but non-zero) outputs.

A design similar to that of FIG. 13 is also considered where the N stage ring counter 102 programmed with a count pattern is replaced by a fixed divider attached to the clock and the predictive coders are replaced by delta-sigma analog to digital converters that are fed by the switches and output of the fixed divider.

The components of FIG. 13 are preferably implemented as portions of specially-designed and manufactured electrical hardware circuitry, for example an integrated system on a chip including all or the majority of the elements as physical components thereof. However, in some cases, one or more the components could also be partially or fully implemented using software, or may operate as provided by or at the direction of configurable firmware.

Note that the number of phases (or paths), which we will designate as N, can be greater than equal to or less than M (the desired number of phase bins). If N is greater than M, then the redundant phase information results in improving the signal to noise ratio of the detection. If N is less than M, much greater demand is placed on the performance of each path to correctly detect the phase of the incoming signal. Of course, the most trivial example of this principle would be the case where M phase bins are created using N=2 (in other words, conventional I-Q detection). Each of the M phase bins would be produced by the weighted sum of I and Q, where the weights would be dependent on the bin being detected. However, quality of the detection could never exceed the performance of a mathematically ideal detector operating on I and Q outputs that exhibit the gain mismatch and deviation from quadrature of an implementation using imperfect analog circuitry.

The ideal method for detecting whether a signal has a particular phase would be to mix it with a signal that matches that exact phase (for example, to detect an ideal cosine wave one would mix it with a signal that is also a cosine, which would generate a DC component that is maximum). Based on this principle, it can be shown that the coefficient for the $n^{th}$ path of N total paths corresponding to the $m^{th}$ bin of M total phase bins would be:

$$K_n^m = \cos\left[2\pi\left(\frac{m}{M} - \frac{n}{N}\right)\right]$$

This is easily checked for the trivial example of QPSK (where N=4 and M=4) . . . note that our notation requires that a "conventional" IQ detection use four phases.

$$K_0^0 = \cos\left[2\pi\left(\frac{0}{4} - \frac{0}{4}\right)\right] = 1 \quad K_1^0 = \cos\left[2\pi\left(\frac{0}{4} - \frac{1}{4}\right)\right] = 0$$

$$K_0^1 = \cos\left[2\pi\left(\frac{1}{4} - \frac{0}{4}\right)\right] = 0 \quad K_1^1 = \cos\left[2\pi\left(\frac{1}{4} - \frac{1}{4}\right)\right] = 1$$

$$K_0^2 = \cos\left[2\pi\left(\frac{2}{4} - \frac{0}{4}\right)\right] = -1 \quad K_1^2 = \cos\left[2\pi\left(\frac{2}{4} - \frac{1}{4}\right)\right] = 0$$

$$K_0^3 = \cos\left[2\pi\left(\frac{3}{4} - \frac{0}{4}\right)\right] = 0 \quad K_2^3 = \cos\left[2\pi\left(\frac{3}{4} - \frac{1}{4}\right)\right] = -1$$

-continued $$K_2^0 = \cos\left[2\pi\left(\frac{0}{4} - \frac{2}{4}\right)\right] = -1 \quad K_3^0 = \cos\left[2\pi\left(\frac{0}{4} - \frac{3}{4}\right)\right] = 0$$

$$K_2^1 = \cos\left[2\pi\left(\frac{1}{4} - \frac{2}{4}\right)\right] = 0 \quad K_3^1 = \cos\left[2\pi\left(\frac{1}{4} - \frac{3}{4}\right)\right] = -1$$

$$K_2^2 = \cos\left[2\pi\left(\frac{2}{4} - \frac{2}{4}\right)\right] = 1 \quad K_3^2 = \cos\left[2\pi\left(\frac{2}{4} - \frac{3}{4}\right)\right] = 0$$

$$K_2^3 = \cos\left[2\pi\left(\frac{3}{4} - \frac{2}{4}\right)\right] = 0 \quad K_3^3 = \cos\left[2\pi\left(\frac{3}{4} - \frac{3}{4}\right)\right] = 1$$

The above example demonstrates a simplification that occurs when M is any even number. For the above example (where M=4) the output of the m=2 phase bin is guaranteed mathematically to be the negative of the m=0 phase bin, and the output of the m=3 phase bin is guaranteed to be the negative of the m=1 phase bin. Hence half of these coefficients are redundant. That being said, producing four phase bin outputs permits the user to determine whether the detection is being performed optimally. Detection with suboptimal phasing would produce even bin outputs that do not vanish when the detected phase is odd or vice versa. Furthermore, it may be desirable to implement the detector using N odd, which then avoids the redundancy previously mentioned.

Figure 14:
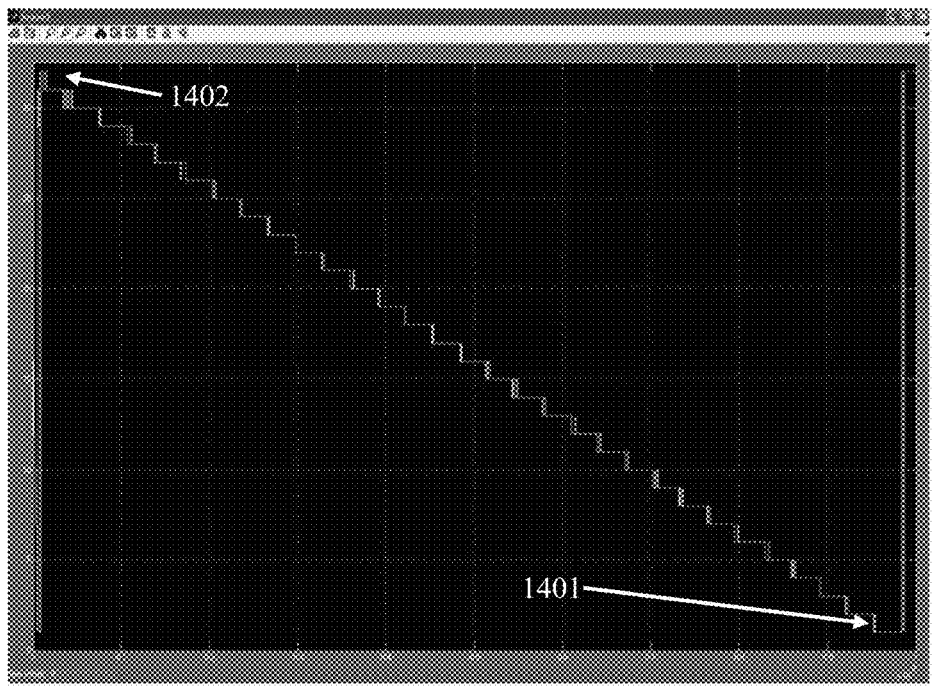
FIG. 14 is a waveform plot of a simulation of FIG. 13.

The simulation of a 32 PSK demodulator is shown in FIG. 14. In the simulation of FIG. 14, the architecture of FIG. 13 is simulated, where the RF input is driven by a signal that is offset in frequency offset from that of the N-stage ring counters by 1 MHz. In FIG. 13, the X-axis is time and the Y-axis is phase (specifically a numeric value indicating which phase bin is active). The result is a waveform that sweeps through $2\pi$ radians of phase in 1 μs. For easy visualization the output of each bin is conveyed in such a way that an output level of "1" (1401) results from Bin 0 being active, while an output level of "32" (1402) results from Bin 31 being active. That is, FIG. 14 is a waveform plot confirming this result in a simulation where within a period of 1 μs, the input waveform "rolls through" $2\pi$ radians of phase (corresponding to 32 phase bins).

A number of schemes may be employed to determine the "maximum likelihood" phase bin output (in the above simulation the "correct" phase bin was determined by observing which phase bin had an output more positive than its two neighbors).

Figure 15:
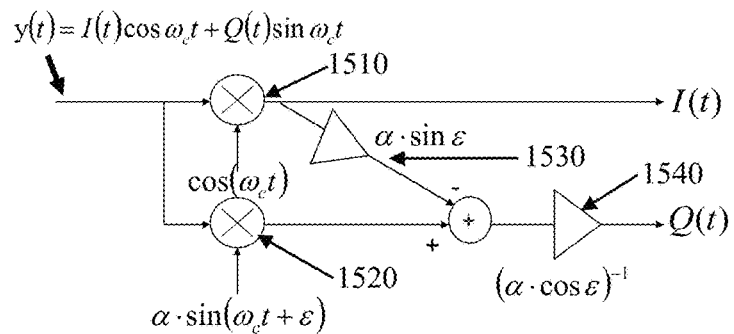
FIG. 15 is block diagram of a simple scheme to compensate for mismatches in gain deviation from quadrature between I and Q.

The block diagram of FIG. 4 was demonstrated (see Table 1) to reduce the inherent gain mismatch and phase deviation from quadrature between the I and Q paths. However, it may nevertheless be desirable to correct for the mismatches remaining in order to effect a "perfect" image cancellation and enhance the overall signal to noise performance of the receiver subsystem. In many cases this mismatch is static (or at least can be approximated so over a frequency band of interest) it can be compensated for using a simple calibration scheme shown below in FIG. 15. FIG. 15 may show a block diagram of a simple scheme to compensate for mismatches in gain deviation from quadrature between I and Q. FIG. 15 may be case where the coefficients of the digital filters of FIG. 4 or FIG. 13 are adjusted to ensure that the "I" and "Q" digital filter outputs (114 and 116, respectively in FIG. 4) are amplitude and phase matched notwithstanding timing and gain imperfections in the outputs of the predictive coders (106).

The analysis of this scheme of FIG. 15 is as follows. Any quadrature downconversion system can be characterized by a gain mismatch (represented as a in the sine path 1520) and a deviation from quadrature (represented as c in 1520). While diagram depicts a zero intermediate frequency (IF) detection, the compensation scheme can be implemented for non-zero IF's in identical fashion. We also assume that the cosine phase (1510) and gain is "correct" since this assumption does not lead to a lack of generality. The effect of these gain and phase errors can be calculated using trigonometric identities:

$$y_I^{IF}(t) = [I(t)\cos\omega_c t + Q(t)\sin\omega_c t] \cdot \cos\omega_c t =$$
$$I(t)\cos^2\omega_c t + Q(t)\sin\omega_c t\cos\omega_c t = \frac{I(t)}{2}(1 + \cos 2\omega_c t) + \frac{Q(t)}{2}\sin 2\omega_c t$$

$$y_Q^{IF}(t) = [I(t)\cos\omega_c t + Q(t)\sin\omega_c t] \cdot \alpha\sin(\omega_c t + \varepsilon) =$$
$$\alpha[I(t)\cos\omega_c t + Q(t)\sin\omega_c t](\cos\varepsilon\sin\omega_c t + \sin\varepsilon\cos\omega_c t) =$$
$$\alpha[I(t)\cos\varepsilon\sin\omega_c t\cos\omega_c t + Q(t)\cos\varepsilon\sin^2\omega_c t +$$
$$I(t)\sin\varepsilon\cos^2\omega_c t + Q(t)\sin\varepsilon\sin\omega_c t\cos\omega_c t] =$$
$$\alpha\cos\varepsilon\frac{I(t)}{2}\sin 2\omega_c t + \alpha\cos\varepsilon\frac{Q(t)}{2}(1 - \cos 2\omega_c t) +$$
$$\alpha\sin\varepsilon\frac{I(t)}{2}(1 + \cos 2\omega_c t) + \alpha\sin\varepsilon\frac{Q(t)}{2}\sin 2\omega_c t$$

As we have done with analyses previously in this disclosure, when we pick out the baseband (or in this case "DC" components) of the above signal:

$$y_I^{BB}(t) = \frac{I(t)}{2}$$

$$y_Q^{BB}(t) = \alpha\cos\varepsilon\frac{Q(t)}{2} + \alpha\sin\varepsilon\frac{I(t)}{2}$$

Of course, we can see here that if we had an ideal situation (where $\alpha=1$ and $\varepsilon=0$) the Q output would produce the trivial and expected result. But we can see here that some of I output has, in a sense, crosstalked its way into Q output. It is also easy to show that this "crosstalk" can be removed as shown below:

$$y_I^{BB}(t) = \frac{I(t)}{2}$$

$$y_Q^{BB}(t) = \alpha\cos\varepsilon\frac{Q(t)}{2} + \alpha\sin\varepsilon\frac{I(t)}{2} = \alpha\cos\varepsilon\frac{Q(t)}{2} + \alpha\sin\varepsilon \cdot y_I^{BB}(t)$$

$$y_Q^{BB}(t) - \alpha\sin\varepsilon \cdot y_I^{BB}(t) = \alpha\cos\varepsilon\frac{Q(t)}{2}$$

$$\frac{y_Q^{BB}(t) - \alpha\sin\varepsilon \cdot y_I^{BB}(t)}{\alpha\cos\varepsilon} = \frac{Q(t)}{2}$$

which (if we renormalize the scaling factor of ½) leads to the diagram of FIG. 15. FIG. 15. Thus, we can see that a correction factor of $\alpha\sin\varepsilon$ (1530 in FIG. 15) times the "I" output would correct for the phase error of the "Q" path. Finally, a scaling of $(\alpha\cos\varepsilon)^{-1}$ (1540 in FIG. 15) corrects the scaling error between the "I" and "Q" paths.

The components of FIG. 15 are preferably implemented as portions of specially-designed and manufactured electrical hardware circuitry, for example an integrated system on a chip including all or the majority of the elements as physical components thereof. However, in some cases, one or more the components could also be partially or fully implemented using software, or may operate as provided by or at the direction of configurable firmware.

The methodology for measuring the coefficients α and ε (i.e., calibrating the system) is fairly straightforward. Consider a sine wave with a frequency $\omega_i$ slightly offset from $\omega_c$. Then:

$$y_I^{IF}(t) = A\cos\omega_i t \cdot \cos\omega_c t = \frac{A}{2}[\cos(\omega_i + \omega_c)t + \cos(\omega_i - \omega_c)t]$$

$$y_Q^{IF}(t) = A\cos\omega_i t \cdot \alpha\sin(\omega_c t + \varepsilon) = \alpha A\cos\omega_i t(\cos\varepsilon\sin\omega_c t + \sin\varepsilon\cos\omega_c t) =$$

$$\alpha A\cos\varepsilon\cos\omega_i t\sin\omega_c t + \alpha A\sin\varepsilon\cos\omega_i t\cos\omega_c t =$$

$$\frac{\alpha A\cos\varepsilon}{2}[\sin(\omega_i + \omega_c)t - \sin(\omega_i - \omega_c)t] +$$

$$\frac{\alpha A\sin\varepsilon}{2}[\cos(\omega_i + \omega_c)t + \cos(\omega_1 - \omega_c)t]$$

Once again taking the "baseband" components only (i.e., the difference frequency):

$$y_I^{BB}(t) = A\cos\omega_i t \cdot \cos\omega_c t = \frac{A}{2}\cos(\omega_i - \omega_c)t$$

$$y_Q^{BB}(t) = \frac{\alpha A\cos\varepsilon}{2}[-\sin(\omega_i - \omega_c)t] + \frac{\alpha A\sin\varepsilon}{2}[\cos(\omega_i - \omega_c)t] =$$

$$\frac{\alpha A}{2}[\sin\varepsilon\cos(\omega_i - \omega_c)t - \cos\varepsilon\sin(\omega_i - \omega_c)t] =$$

$$-\frac{\alpha A}{2}[\sin(\omega_i - \omega_c)t\cos\varepsilon - \cos(\omega_i - \omega_c)t\sin\varepsilon] =$$

$$-\frac{\alpha A}{2}\sin[(\omega_i - \omega_c)t - \varepsilon] =$$

$$\frac{\alpha A}{2}\left[\sin(\omega_i - \omega_c)t\sin\left(\varepsilon - \frac{\pi}{2}\right) + \cos(\omega_i - \omega_c)t\cos\left(\varepsilon - \frac{\pi}{2}\right)\right] =$$

$$\frac{\alpha A}{2}\cos\left[(\omega_i - \omega_c)t - \left(\varepsilon - \frac{\pi}{2}\right)\right] = \frac{\alpha A}{2}\cos\left[(\omega_i - \omega_c)t + \left(\frac{\pi}{2} - \varepsilon\right)\right]$$

Thus the result is a pair of sine waves with the "I" output assumed to be the reference phase and amplitude and the "Q: output scaled (relative to "I") in amplitude by α and with a phase lead of $$\frac{\pi}{2} - \varepsilon$$

radians. A number of methods may be employed to measure the amplitude and phase of the "I" and "Q" outputs directly. One such method is the IEEE-STD-1057 algorithm. Other methods (such as using a digitally synthesized cosine and sine wave to extract the phase and amplitude of $y_1^{BB}(t)$ and $y_Q^{BB}(t)$) may also be employed.

A connection can be explained between this embodiment of FIG. 15, this methodology and the structure in FIG. 4 as follows. The implementation of this correction can be embedded into the digital filter (108 and 110 in FIG. 4). If the "I" output (114 in FIG. 4) is defined as the scaled sum of outputs of the N predictive coders (labeled 106 in FIG. 4):

$$\sum_{n=0}^{N-1} C_n^I \cdot PC_n$$

where PCn is defined as the output of the nth predictive coder and the "Q" output (116 in FIG. 4) under a "no mismatch" condition is similarly defined as another scaled sum of the N predictive coders (again 106 in FIG. 4):

$$\sum_{n=0}^{N-1} C_n^Q \cdot PC_n$$

then the correction for α and ε can be applied by calculating a modified set of coefficients for the Q output as follows:

$$Q(\text{corrected}) = \sum_{n=0}^{N-1} K_n^Q \cdot PC_n$$

where:

$$K_n^Q \stackrel{def}{=} \frac{C_n^Q + (\alpha\sin\varepsilon) \cdot C_n^I}{\alpha\cos\varepsilon}$$

The objective of any direct sampling scheme is to minimize the noise that referred to the input (in this case the wireless transmission being received). At low speeds oversampling converters (such as delta-sigma converters, predictive coders, or noise shaping converters) are capable of achieving exceptionally high signal-to-noise ratios (SNRs) with SNRs in excess of 100 dB being commonplace. Yet, the behavior of high speed semiconductor circuitry operating at clock rates appropriate for oversampling wireless transmissions (in excess of 1 GHz) have comparatively poor SNR (in rough numbers 60-70 dB, or between 10-11 effective bits).

In this embodiment, the input signal is essentially divided into subbands and each subband is quantized using oversampled quantization in a temporally coordinated way that allows the reconstruction of the original baseband signal from the several narrowband "pieces". By limiting the bandwidth over which any single quantizer must operate, it is possible to create wideband converter that nevertheless exhibits the same signal-to-noise ratio as the converter for any single subband.

Figure 16:
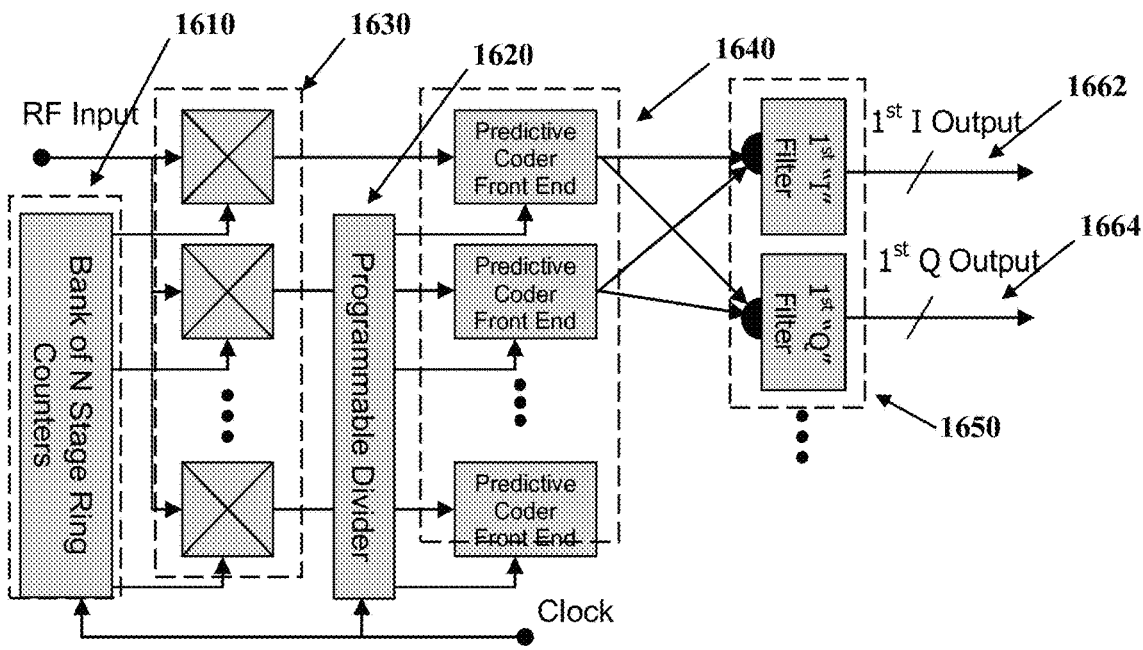
FIG. 16 is a block diagram of a wireless communications device that implements a wideband receiver with coordinated sub-band quantization.

The block diagram of such a receiver is shown in FIG. 16. FIG. 16 may be a block diagram of a wireless communications device that implements a wideband receiver with coordinated sub-band quantization. Note that the architecture is identical to that of FIG. 4 with two exceptions: (1) the counter (now counters 1610) driving the input switching stage and (2) the combining network following the bank of oversampling converters. A more detailed explanation of the operation follows.

In this embodiment shown in FIG. 16, the switching stage (1630) is used to create a bank of I-Q pairs each designed to downconvert a subband of the input signal to a convenient intermediate frequency (IF), which is then converted to digital data streams by the predictive coders (1640) representing the outputs of the switching network (1630). The output of the predictive coders are processed through digital filters (1650) to produce pairs of I and Q output (1662, 1664), each representing the signal content of a particular subband.

While not necessary, in the preferred embodiment all of the subbands are converted to matching intermediate frequencies in order to ensure delay matching between paths. The number of subbands used is chosen by the designer in order to achieve a desired effective resolution (effective number of bits, or ENOB). For a given clock rate of the programmable divider (1620) and order for the predictive coder, a narrower subband will yield a higher ENOB, but a given total bandwidth will then require more subbands. Alternatively, a wider subband will cover a given bandwidth using fewer subbands, but will achieve a lower ENOB (for a given programmable divider clock rate and predictive coder order).

The components of FIG. 16 are preferably implemented as portions of specially-designed and manufactured electrical hardware circuitry, for example an integrated system on a chip including all or the majority of the elements as physical components thereof. However, in some cases, one or more the components could also be partially or fully implemented using software, or may operate as provided by or at the direction of configurable firmware.

In one embodiment, a single pair of predictive coders is used to perform the I-Q downconversion and quantization (equivalent to FIG. 4 where N=2). However, it is also possible in an alternate embodiment to group more than two paths in a multiphase configuration (per FIG. 4) to construct I-Q outputs using the first embodiment of this invention.

In the preferred embodiment, an ensemble of subbands are downconverted to a prescribed intermediate frequency. This requires that the following equation be satisfied (assuming low-side injection):

$$f_{IF} = f_{in} - f_{counter}$$

$$f_{counter} = f_{in} - f_{IF}$$

In one embodiment the switching waveforms may be generated by digital synthesis. For this embodiment, if we further define $f_{in} \equiv f_0 + k \cdot \Delta f$ where k is a programmed constant (defining the subband) and arrange it so that $f_0 - f_{IF} \equiv R \Delta f$ where R is a fixed constant, then:

$$f_{counter} = f_{in} - f_{IF} = f_0 + k \cdot \Delta f - f_{IF}$$

$$= f_0 - f_{IF} + k \cdot \Delta f = (R+k) \Delta f$$

Further arranging it so that the bandwidth is an integer submultiple of a high speed master clock frequency, such that $$\Delta f \equiv \frac{f_{clk}}{D}.$$

Figure 17:
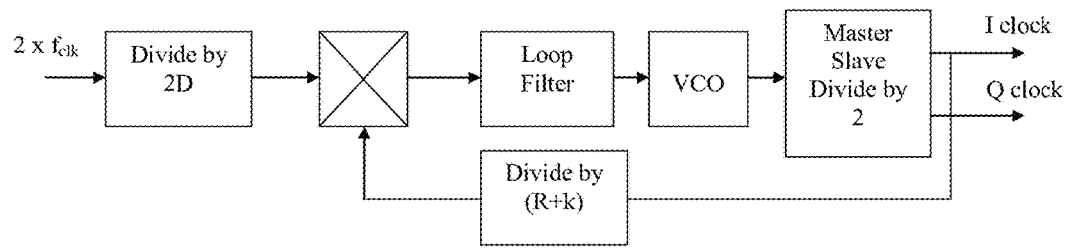
FIG. 17 is a block diagram of a PLL based synthesizer used to generate the input switching waveforms for the subband downconversion in the "coordinated subband" embodiments.

The result is simple rational fraction digital synthesis solution:

$$f_{counter} = (R+k)\Delta f = (R+k)\frac{f_{clk}}{D} = \frac{R+k}{D}f_{clk},$$

which is easily synthesized using the phaselocked loop synthesizer shown in FIG. 17. FIG. 17 may be a block diagram of a PLL based synthesizer used to generate the input switching waveforms for the subband downconversion in the "coordinated subband" embodiments.

The components of FIG. 17 are preferably implemented as portions of specially-designed and manufactured electrical hardware circuitry, for example an integrated system on a chip including all or the majority of the elements as physical components thereof. However, in some cases, one or more the components could also be partially or fully implemented using software, or may operate as provided by or at the direction of configurable firmware.

The generation of I/Q waveforms through the use of a master-slave flip-flop was already discussed previously (see the discussion on the N stage ring counter on p. 4).

In a variation of this embodiment, a pair of circuits as shown in FIG. 17 are preceded by a conventional quadrature downconversion stage. In this variation, the first local oscillator is arranged to have a frequency that is very close to the incoming RF such that the output IF is half the desired detection bandwidth.

Figure 18:
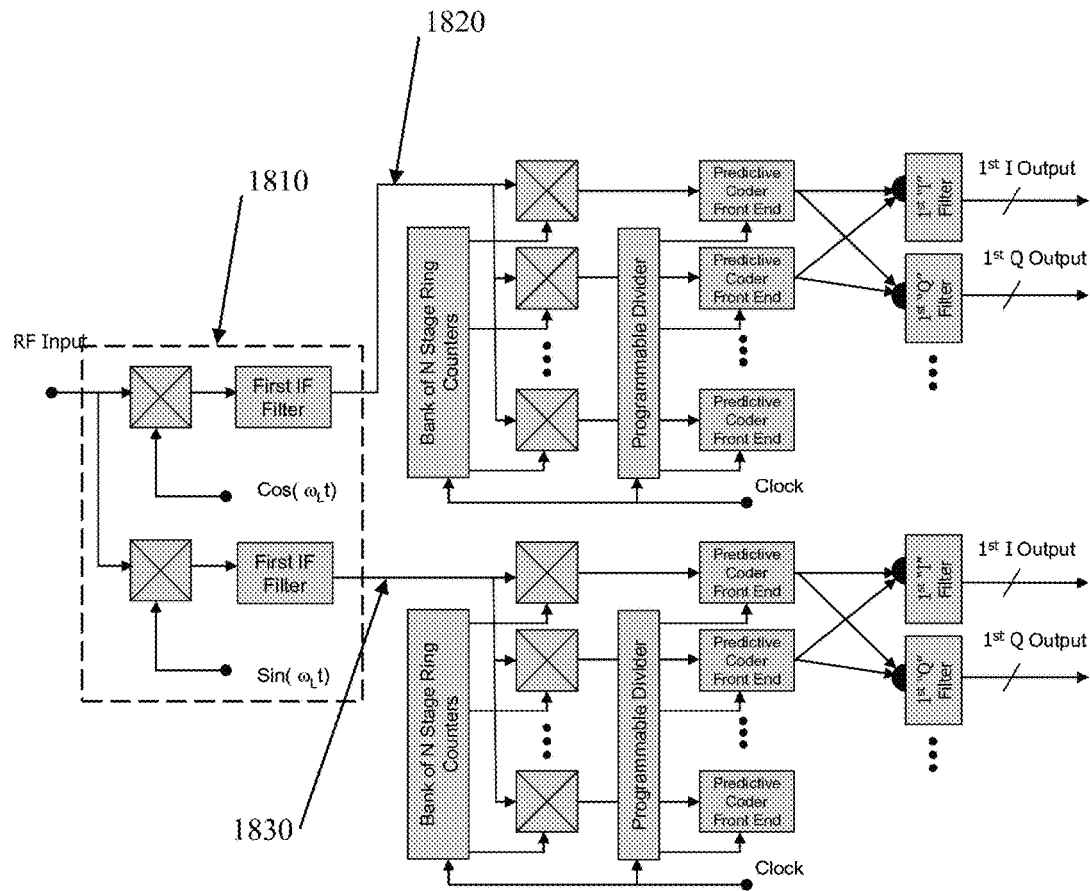
FIG. 18 is a block diagram of a coordinated subband quantization architecture wherein a conventional I-Q downconversion is used at the front end.

A block diagram of this embodiment is shown in FIG. 18. FIG. 18 may be a block diagram of a coordinated subband quantization architecture wherein a conventional I-Q downconversion is used at the front end. A downconversion stage (1810) shifts the signal of an incoming wireless transmission to a lower intermediate frequency (IF). Each of the I (1820) and Q (1830) outputs of the downconversion stage is then converted to a second intermediate frequency and subsequently to a digital form through a switching network, a collection of predictive coders, and a pair of digital filters (similar in form to that of FIG. 4)—one for each subband.

The components of FIG. 18 are preferably implemented as portions of specially-designed and manufactured electrical hardware circuitry, for example an integrated system on a chip including all or the majority of the elements as physical components thereof. However, in some cases, one or more the components could also be partially or fully implemented using software, or may operate as provided by or at the direction of configurable firmware.

Figure 19:
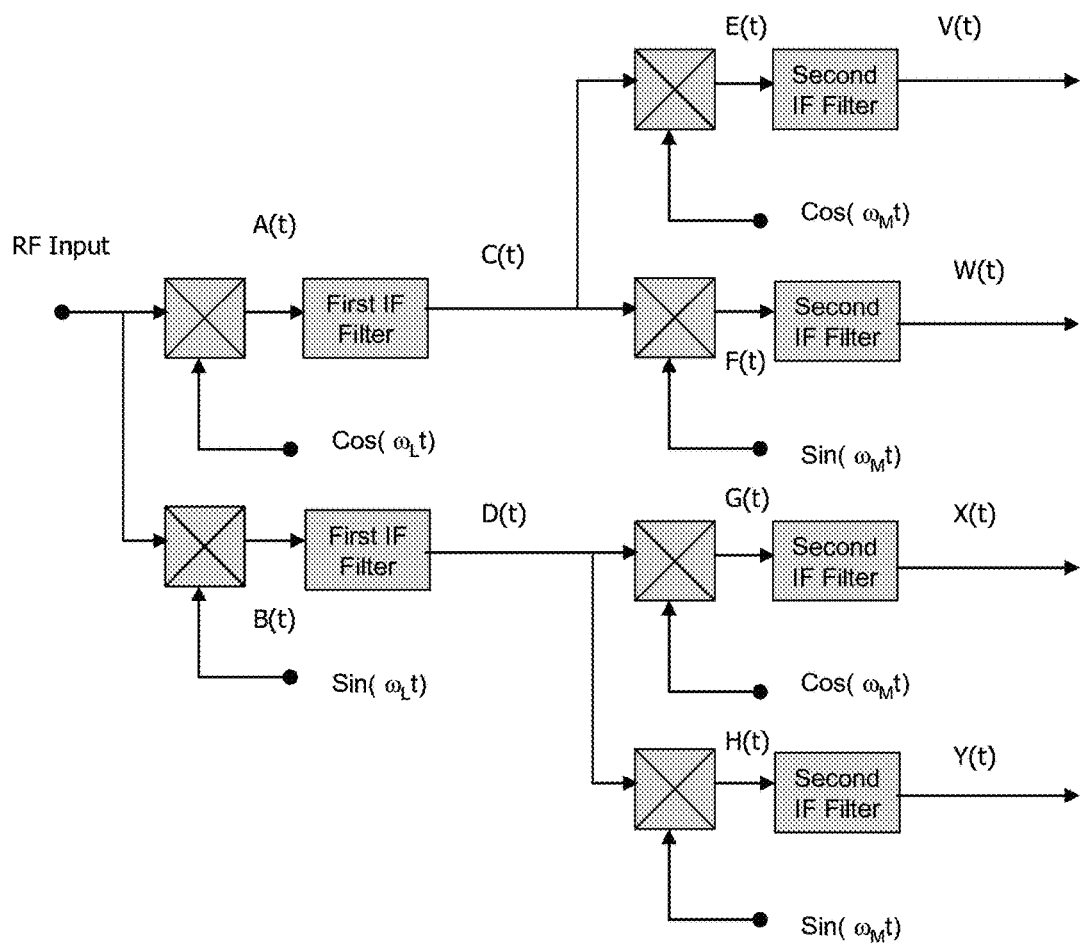
FIG. 19 is a block diagram of a two stage I-Q image cancelling mixing operation.

The fundamental operating principle behind both of these architectures is the image cancelling property of two I-Q mixing operations performed "back-to-back". A simplified block diagram is shown in FIG. 19. FIG. 19 may be a block diagram of a two stage I-Q image cancelling mixing operation. The analysis below refers to the signal names in this diagram. For mathematical simplicity the analysis uses sine waves, but these conclusions are easily extended to switching waveforms as long as certain bandwidth constraints are met.

The components of FIG. 19 are preferably implemented as portions of specially-designed and manufactured electrical hardware circuitry, for example an integrated system on a chip including all or the majority of the elements as physical components thereof. However, in some cases, one or more the components could also be partially or fully implemented using software, or may operate as provided by or at the direction of configurable firmware.

Let us assume once again that the input waveform is a modulated carrier waveform represented as: RF(t)≡I(t)cos $\omega_c t$+Q(t)sin $\omega_c t$, Then the signals A(t) and B(t) are calculated as follows:

$$A(t) = RF(t) \cdot \cos \omega_L t = [I(t)\cos \omega_c t + Q(t)\sin \omega_c t] \cos \omega_L t$$

$$= I(t)\cos \omega_c t \cos \omega_L t + Q(t)\sin \omega_c t \cos \omega_L t$$

$$B(t) = RF(t) \cdot \sin \omega_L t = [I(t)\cos \omega_c t + Q(t)\sin \omega_c t] \sin \omega_L t$$

$$= I(t)\cos \omega_c t \sin \omega_L t + Q(t)\sin \omega_c t \sin \omega_L t$$

A(t) and B(t) are further simplified to:

$$A(t) = \frac{I(t)}{2}[\cos(\omega_c - \omega_L)t + \cos(\omega_c + \omega_L)t] +$$

$$\frac{Q(t)}{2}[\sin(\omega_c - \omega_L)t + \sin(\omega_c + \omega_L)t]$$

$$B(t) = \frac{I(t)}{2}[-\sin(\omega_c - \omega_L)t + \sin(\omega_c + \omega_L)t] +$$
$$\frac{Q(t)}{2}[\cos(\omega_c - \omega_L)t - \cos(\omega_c + \omega_L)t]$$

C(t) and D(t) are produced by selecting the difference frequency while rejecting the sum frequency:

$$C(t) = \frac{I(t)}{2}[\cos(\omega_c - \omega_L)t] + \frac{Q(t)}{2}[\sin(\omega_c - \omega_L)t]$$
$$D(t) = \frac{I(t)}{2}[-\sin(\omega_c - \omega_L)t] + \frac{Q(t)}{2}[\cos(\omega_c - \omega_L)t]$$

E(t), F(t), G(t), and H(t) are defined as follows:

$$E(t) = C(t) \cdot \cos \omega_M t$$
$$= \left\{ \frac{I(t)}{2}[\cos(\omega_c - \omega_L)t] + \frac{Q(t)}{2}[\sin(\omega_c - \omega_L)t] \right\} \cos \omega_M t$$
$$= \frac{I(t)}{2}\cos(\omega_c - \omega_L)t \cos \omega_M t + \frac{Q(t)}{2}[\sin(\omega_c - \omega_L)t]\cos \omega_M t$$

$$F(t) = C(t) \cdot \sin \omega_M t$$
$$= \left\{ \frac{I(t)}{2}[\cos(\omega_c - \omega_L)t] + \frac{Q(t)}{2}[\sin(\omega_c - \omega_L)t] \right\} \sin \omega_M t$$
$$= \frac{I(t)}{2}\cos(\omega_c - \omega_L)t \sin \omega_M t + \frac{Q(t)}{2}[\sin(\omega_c - \omega_L)t]\sin \omega_M t$$

$$G(t) = D(t) \cdot \cos \omega_M t$$
$$= \left\{ \frac{I(t)}{2}[-\sin(\omega_c - \omega_L)t] + \frac{Q(t)}{2}[\cos(\omega_c - \omega_L)t] \right\} \cos \omega_M t$$
$$= \frac{I(t)}{2}[-\sin(\omega_c - \omega_L)t]\cos \omega_M t + \frac{Q(t)}{2}[\cos(\omega_c - \omega_L)t]\cos \omega_M t$$

$$H(t) = D(t) \cdot \sin \omega_M t$$
$$= \left\{ \frac{I(t)}{2}[-\sin(\omega_c - \omega_L)t] + \frac{Q(t)}{2}[\cos(\omega_c - \omega_L)t] \right\} \sin \omega_M t$$
$$= \frac{I(t)}{2}[-\sin(\omega_c - \omega_L)t]\sin \omega_M t + \frac{Q(t)}{2}[\cos(\omega_c - \omega_L)t]\sin \omega_M t$$

The above can be simplified as follows:

$$E(t) = \frac{I(t)}{4}\{\cos[(\omega_c - \omega_L) + \omega_M]t + \cos[(\omega_c - \omega_L) - \omega_M]t\} +$$
$$\frac{Q(t)}{4}\{\sin[(\omega_c - \omega_L) + \omega_M]t + \sin[(\omega_c - \omega_L) - \omega_M]t\}$$

$$F(t) = \frac{I(t)}{4}\{\sin[(\omega_c - \omega_L) + \omega_M]t - \sin[(\omega_c - \omega_L) - \omega_M]t\} +$$
$$\frac{Q(t)}{4}\{-\cos[(\omega_c - \omega_L) + \omega_M]t + \cos[(\omega_c - \omega_L) - \omega_M]t\}$$

$$G(t) = -\frac{I(t)}{4}\{\sin[(\omega_c - \omega_L) + \omega_M]t + \sin[(\omega_c - \omega_L) - \omega_M]t\} +$$
$$\frac{Q(t)}{4}\{\cos[(\omega_c - \omega_L) + \omega_M]t + \cos[(\omega_c - \omega_L) - \omega_M]t\}$$

$$H(t) = -\frac{I(t)}{4}\{-\cos[(\omega_c - \omega_L) + \omega_M]t + \cos[(\omega_c - \omega_L) - \omega_M]t\} +$$
$$\frac{Q(t)}{4}\{\sin[(\omega_c - \omega_L) + \omega_M]t - \sin[(\omega_c - \omega_L) - \omega_M]t\}$$

When terms are combined as shown:

$$E(t) + H(t) = \frac{I(t)}{2}\cos[(\omega_c - \omega_L) + \omega_M]t + \frac{Q(t)}{2}\sin[(\omega_c - \omega_L) + \omega_M]t$$

$$F(t) + G(t) = -\frac{I(t)}{2}\sin[(\omega_c - \omega_L) - \omega_M]t + \frac{Q(t)}{2}\cos[(\omega_c - \omega_L) - \omega_M]t$$

$$E(t) - H(t) = \frac{I(t)}{2}\cos[(\omega_c - \omega_L) - \omega_M]t + \frac{Q(t)}{2}\sin[(\omega_c - \omega_L) - \omega_M]t$$

$$F(t) - G(t) = \frac{I(t)}{2}\sin[(\omega_c - \omega_L) + \omega_M]t + \frac{Q(t)}{2}\cos[(\omega_c - \omega_L) + \omega_M]t$$

To demonstrate the image cancelling properties, consider case where the second IF is zero, i.e., $\omega_c - \omega_L = \omega_M$ $$E(t) + H(t) = \frac{I(t)}{2}\cos[2(\omega_c - \omega_L)]t + \frac{Q(t)}{2}\sin[2(\omega_c - \omega_L)]t$$

$$F(t) + G(t) = \frac{Q(t)}{2}$$

$$E(t) - H(t) = \frac{I(t)}{2}$$

$$F(t) - G(t) = \frac{I(t)}{2}\sin[2(\omega_c - \omega_L)]t + \frac{Q(t)}{2}\cos[2(\omega_c - \omega_L)]t$$

In other words, the signals of interest that are centered about the carrier frequency that is above the local oscillator frequency $\omega_c = \omega_L + \omega_M$ are translated down to baseband (and appearing in the signals F(t)+G(t) and E(t)−H(t)). But the "image" frequency (a carrier frequency located below the local oscillator frequency) where $\omega_L = \omega_c + \omega_M$ are translated up to twice the IF. This implies that in the ideal case, the baseband content must be less in bandwidth than $\omega_M$. In practice we would want to limit the baseband content to significantly less than this to avoid unrealistic demands on the lowpass filter that passes the baseband content while rejecting signals centered at twice $\omega_M$.

Alternatively, for the high side injection case where $\omega_L - \omega_c = \omega_M \rightarrow \omega_c - \omega_L = -\omega_M$:

$$E(t) + H(t) = \frac{I(t)}{2}$$

$$F(t) + G(t) = -\frac{I(t)}{2}\sin[-2(\omega_L - \omega_c)]t + \frac{Q(t)}{2}\cos[-2(\omega_L - \omega_c)]t$$

$$E(t) - H(t) = \frac{I(t)}{2}\cos[-2(\omega_L - \omega_c)]t + \frac{Q(t)}{2}\sin[-2(\omega_L - \omega_c)]t$$

$$F(t) - G(t) = \frac{Q(t)}{2}$$

Thus we see that signals below the local oscillator frequency $\omega_L$ appear exclusively in the signals E(t)+H(t) and F(t)−G(t). In the preferred embodiment, we will choose to downconvert signals that are higher in frequency than $\omega_L$ so that we can avoid spectrum reversal in the first stage (i.e, the highest frequencies translating into the lowest frequencies and vice versa).

For the purpose of explaining how this frequency translation scheme of this embodiment is used to perform wideband quantization, let us represent the wideband modulation of a signal as follows:

$$I(t) = I_0(t) + I_1(t) + \ldots + I_{N_B-1}(t)$$

$$Q(t) = Q_0(t) + Q_1(t) + \ldots + Q_{N_B-1}(t)$$

where:
$I_k(t), Q_k(t)$ represents the information contained in the $k^{th}$ subband, and $N_B$ represents the total number of subbands into which the signal is being broken.

Although not required, in the preferred embodiment the width of all the subbands is identical, so that the total bandwidth of the signal being quantized is $N_B \cdot \Delta f$, where (in accordance with the preceding discussion)

$$\Delta f < \frac{\omega_M}{2\pi}.$$

For convenience we will represent the "base" frequency of the total bandwidth being processed by the receiver as $\omega_c$ even though the complete bandwidth may contain multiple signals and (strictly speaking) the conventional view of a "carrier frequency" is that it represents the middle of a spectrum (rather than the minimum frequency of an occupied spectrum).

Keeping in mind the assumed relationship between frequency and radian frequency ( $$\left(f \equiv \frac{\omega}{2\pi}\right)$$

the subbands are thus defined to occupy the frequencies are shown below:

$I_0(t), Q_0(t): f \in [0, \Delta f]$ $I_1(t), Q_1(t): f \in [\Delta f, 2\Delta f]$ $\vdots$ $I_{N_B-1}(t), Q_{N_B-1}(t): f \in [(N_B - 1)\Delta f, N_B \Delta f]$ such that:

$RF(t): f \in [f_c, f_c + N_B \Delta f]$ where:

$$f_c \equiv \frac{\omega_c}{2\pi}$$

In the time domain, RF(t) can be expressed as follows:

$RF(t) = I(t)\cos \omega_c t + Q(t)\sin \omega_c t = I_0(t)\cos \omega_c t + I_1(t)\cos \omega_c t + \ldots +$
$I_{N_B-1}(t)\cos \omega_c t + Q_0(t)\sin \omega_c t + Q_1(t)\sin \omega_c t + \ldots + Q_{N_B-1}(t)\sin \omega_c t.$ It is also convenient to express RF(t) in terms of "baseband versions" of the individual subband components. We will represent these with the symbols $\hat{I}_k(t), \hat{Q}_k(t)$ corresponding to the $k^{th}$ subband components $I_k(t), Q_k(t)$. The relationship between these components is easily derived as follows:

$$\begin{aligned}
I_k(t)\cos \omega_c t + Q_k(t)\sin \omega_c t &\equiv \hat{I}_k(t)\cos(\omega_c + k\Delta\omega)t + \hat{Q}_k(t)\sin(\omega_c + k\Delta\omega)t \\
&= \hat{I}_k(t)\cos \omega_c t \cos k\Delta\omega t - \\
&\quad \hat{I}_k(t)\sin \omega_c t \sin k\Delta\omega t + \\
&\quad \hat{Q}_k(t)\sin \omega_c t \cos k\Delta\omega t + \\
&\quad \hat{Q}_k(t)\cos \omega_c t \sin k\Delta\omega t \\
&= [\hat{I}_k(t)\cos k\Delta\omega t + \hat{Q}_k(t)\sin k\Delta\omega t]\cos \omega_c t + \\
&\quad [\hat{Q}_k(t)\cos k\Delta\omega t - \hat{I}_k(t)\sin k\Delta\omega t]\sin \omega_c t
\end{aligned}$$

where $\Delta\omega \equiv 2\pi\Delta f$.

This suggests the following correspondences:

$I_k(t) \equiv \hat{I}_k(t)\cos k\Delta\omega t + \hat{Q}_k(t)\sin k\Delta\omega t$ $Q_k(t) \equiv \hat{Q}_k(t)\cos k\Delta\omega t - \hat{I}_k(t)\sin k\Delta\omega t$ or:

$\hat{I}_k(t) \equiv I_k(t)\cos k\Delta\omega t - Q_k(t)\sin k\Delta\omega t$ $\hat{Q}_k(t) \equiv Q_k(t)\cos k\Delta\omega t + I_k(t)\sin k\Delta\omega t$ In terms of $\hat{I}_k(t), \hat{Q}_k(t)$, we can express RF(t) thus:

$RF(t) = I_0(t)\cos \omega_c t + \hat{I}_1(t)\cos(\omega_c + \Delta\omega)t + \ldots +$
$\hat{I}_{N_B-1}(t)\cos[\omega_c + (N_B - 1)\Delta\omega]t + Q_0(t)\sin \omega_c t +$
$\hat{Q}_1(t)\sin(\omega_c + \Delta\omega)t + \ldots + \hat{Q}_{N_B-1}(t)\sin[\omega_c + (N_B - 1)\Delta\omega]t$ Note that for the k=0 ("baseband") case $\hat{I}_k(t), \hat{Q}_k(t)$ are identically equal to $I_k(t), Q_k(t)$.

The embodiments shown in FIG. 16 and FIG. 18 handle the downconversion scheme slightly differently. We will explain the differences below:

In the embodiment of FIG. 16, the object of the first stage is to translate each of the subbands to baseband (or a conveniently low IF in the event that we may want to avoid the 1/f noise corner). For mathematical simplicity let us consider the baseband case. The required value of the local oscillator (LO) frequency $$f_L \equiv \frac{\omega_L}{2\pi}$$

for each of the subbands would be as follows:

$I_0(t), Q_0(t): f_L = f_c$ $I_1(t), Q_1(t): f_L = f_c + \Delta f$ $\ldots$ $I_{N_B-1}(t), Q_{N_B-1}(t): f_L = f_c + (N_B - 1)\Delta f$ where the output of each of the downconverters occupies a bandwidth of "DC" to $\Delta f$. If we consider the $\hat{I}_k(t), \hat{Q}_k(t)$ based expansion for RF(t), the output of each subband downconverter would be:

$$IF_k^I(t) = \left[\hat{I}_k(t)\cos(\omega_c + k\Delta\omega)t + \hat{Q}_k(t)\sin(\omega_c + k\Delta\omega)t\right]\cos(\omega_c + k\Delta\omega)t$$

$$= \hat{I}_k(t)\cos^2(\omega_c + k\Delta\omega)t + \hat{Q}_k(t)\sin(\omega_c + k\Delta\omega)t\cos(\omega_c + k\Delta\omega)t$$

$$= \frac{\hat{I}_k(t)}{2}[1 + \cos 2(\omega_c + k\Delta\omega)t] + \frac{\hat{Q}_k(t)}{2}\sin 2(\omega_c + k\Delta\omega)t$$

$$IF_k^Q(t) = \left[\hat{I}_k(t)\cos(\omega_c + k\Delta\omega)t + \hat{Q}_k(t)\sin(\omega_c + k\Delta\omega)t\right]\sin(\omega_c + k\Delta\omega)t$$

$$= \hat{I}_k(t)\cos(\omega_c + k\Delta\omega)t\sin(\omega_c + k\Delta\omega)t + \hat{Q}_k(t)\sin^2(\omega_c + k\Delta\omega)t$$

$$= \frac{\hat{I}_k(t)}{2}\sin 2(\omega_c + k\Delta\omega)t + \frac{\hat{Q}_k(t)}{2}[1 - \cos 2(\omega_c + k\Delta\omega)t]$$

Using the notation BB{ } to indicate extracting the baseband component through lowpass filtering:

$$BB\{IF_k^I(t)\} = \frac{\hat{I}_k(t)}{2}$$

$$BB\{IF_k^Q(t)\} = \frac{\hat{Q}_k(t)}{2}$$

In this configuration the final stage is used to restore each of the subbands to their relative position (in frequency). This is done using $\omega_M = k\Delta\omega$:

If we consider the outputs E(t)+H(t) and F(t)−G(t), we can see in accordance to the relationships derived earlier:

$$F(t) - G(t) = \frac{\hat{I}_k(t)}{2}\sin k\Delta\omega t - \frac{\hat{Q}_k(t)}{2}\cos k\Delta\omega t \equiv -Q_k(t)$$

$$E(t) + H(t) = \frac{\hat{I}_k(t)}{2}\cos k\Delta\omega t + \frac{\hat{Q}_k(t)}{2}\sin k\Delta\omega t \equiv I_k(t)$$

Figure 20:
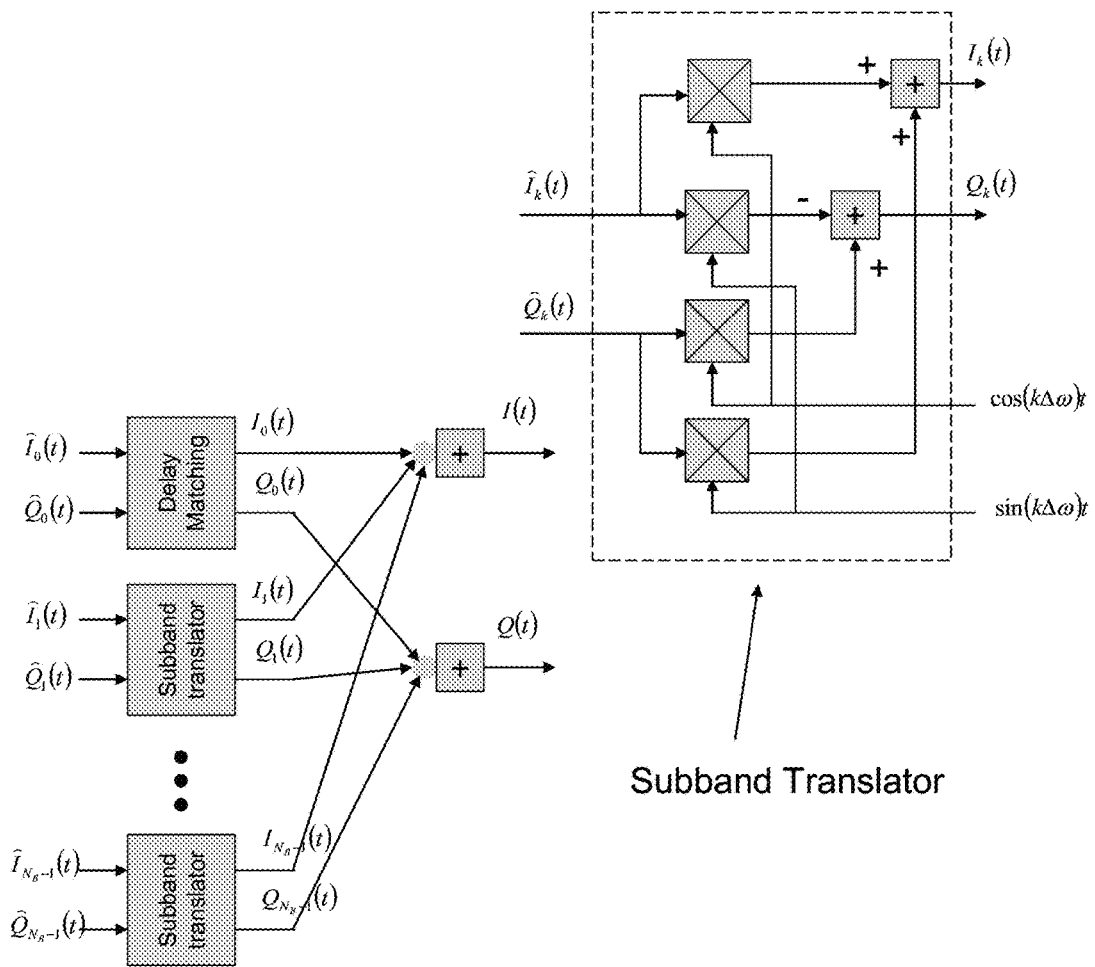
FIG. 20 may be a block diagram of a wideband reconstruction network that includes the subband translation and recombining.

This indicates that the original subband content has been restored. In a final step, we must recombine all of the subband contents into the original wideband content. A network designed to accomplish this is shown in FIG. 20. FIG. 20 may be a block diagram of a wideband reconstruction network that includes the subband translation and recombining. Note that the zeroth subband does not require translation and thus the subband translator is replaced with a delay network that matches the group delay of the subband translators.

The components of FIG. 20 are preferably implemented as portions of specially-designed and manufactured electrical hardware circuitry, for example an integrated system on a chip including all or the majority of the elements as physical components thereof. However, in some cases, one or more the components could also be partially or fully implemented using software, or may operate as provided by or at the direction of configurable firmware.

CLOSING COMMENTS

Throughout this description, the technologies described and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one technology are not intended to be excluded from a similar role in other technologies.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A wireless transmission receiver comprising:
   an N stage ring counter programmed with a count pattern, wherein N is an integer of value greater than one;
   the N stage ring counter for producing an N-cycle digital waveform;
   a combiner for combining said N-cycle digital waveform with a wireless transmission;
   predictive coders for oversampling said combined digital waveform and said wireless transmission to form a high speed serial stream, said high speed serial stream comprised of a signal of interest and a quantization noise signal;
   a suppressor for suppressing said quantization noise signal;
   a converter for converting said high speed data stream into a lower speed;
   a clock coupled to said N stage ring counter;
   an N path switching network;
   at least two predictive coders, wherein a respective one of said at least two predictive coders is coupled to a respective switch of said N path switching network; and
   at least two (M) digital filters, each configured to receive an output signals from all of said at least two predictive coders, wherein the outputs of each of the at least two digital filters, each represent one phase state of a phase-shift keyed wireless transmission with M possible phase states, wherein the converter is an N stage ring counter programmed with a count pattern; and wherein the phase states correspond to bins and "Bin 0" is prescribed to correspond to a phase of zero while "Bin M−1" is prescribed to represent a phase of $$2\pi\frac{M-1}{M}.$$

2. The receiver of claim 1, wherein said N stage ring counter is configured to produce a clock signal for an N path switching network and an at least one predictive coder.

3. The receiver of claim 2, wherein said N path switching network comprises at least one switch adapted to receive an input signal.

4. A wireless transmission receiver comprising:
an N stage ring counter programmed with a count pattern, wherein N is an integer of value greater than one;
the N stage ring counter for producing an N-cycle digital waveform;
a combiner for combining said N-cycle digital waveform with a wireless transmission;
predictive coders for oversampling said combined digital waveform and said wireless transmission to form a high speed serial stream, said high speed serial stream comprised of a signal of interest and a quantization noise signal;
a suppressor for suppressing said quantization noise signal;
a converter for converting said high speed data stream into a lower speed;
a clock coupled to said N stage ring counter;
an N path switching network;
at least two predictive coders, wherein a respective one of said at least two predictive coders is coupled to a respective switch of said N path switching network; and
at least two (M) digital filters, each configured to receive an output signals from all of said at least two predictive coders, wherein the outputs of each of the at least two digital filters, each represent one phase state of a phase-shift keyed wireless transmission with M possible phase states;
wherein coefficients of the digital filters are adjusted to ensure that "I" and "Q" outputs of the at least two digital filters are amplitude and phase matched notwithstanding timing and gain imperfections in the output signals from all of said at least two predictive coders.

5. A wireless transmission receiver comprising:
an N stage ring counter programmed with a count pattern, wherein N is an integer of value greater than one;
the N stage ring counter for producing an N-cycle digital waveform;
a combiner for combining said N-cycle digital waveform with a wireless transmission;
predictive coders for oversampling said combined digital waveform and said wireless transmission to form a high speed serial stream, said high speed serial stream comprised of a signal of interest and a quantization noise signal;
a suppressor for suppressing said quantization noise signal;
a converter for converting said high speed data stream into a lower speed;
a clock coupled to said N stage ring counter;
an N path switching network;
at least two predictive coders, wherein a respective one of said at least two predictive coders is coupled to a respective switch of said N path switching network;
at least two (M) digital filters, each configured to receive an output signals from all of said at least two predictive coders, wherein the outputs of each of the at least two digital filters, each represent one phase state of a phase-shift keyed wireless transmission with M possible phase states; and
N paths, each path from a switch of the N path switching network to a predictive coder of the at least two predictive coders,
wherein each of the N stage ring counters is configured to produce a different output frequency such that each of N paths processes a relatively narrow subband of a wideband input; said subbands corresponding to each path are arranged in order of ascending frequency; and collectively these subbands cover a wide frequency span.

6. The wireless transmission receiver of claim 5, wherein the wideband input is an intermediate frequency signal formed by downconverting a wireless transmission.

7. A method of receiving a wireless transmission comprising the steps of:
programming a count pattern into an N stage ring counter, wherein N is an integer of value greater than one;
producing an N-cycle digital waveform;
combining said N-cycle digital waveform with said wireless transmission;
oversampling said combined digital waveform and said wireless transmission to form a high speed serial stream, said high speed serial stream comprised of a signal of interest and a quantization noise signal;
suppressing said quantization noise signal;
converting said high speed data stream into a lower speed;
clocking said N stage ring counter with a clock coupled to the counter;
wherein combining includes using an N path switching network;
receiving an output from a respective switch of said N path switching network at a respective predictive coder of at least two predictive coders; and
receiving output signals from all of said at least two predictive coders at each of least two (M) digital filters, wherein the outputs of each of the at least two digital filters, each represent one phase state of a phase-shift keyed wireless transmission with M possible phase states wherein the converter is an N stage ring counter programmed with a count pattern; and wherein the phase states correspond to bins and "Bin 0" is prescribed to correspond to a phase of zero while "Bin M−1" is prescribed to represent a phase of $$2\pi \frac{M-1}{M}.$$

8. The method of claim 7, wherein said N stage ring counter is configured to produce a clock signal for an N path switching network and an at least one predictive coder.

9. The method of claim 8, wherein said N path switching network comprises at least one switch adapted to receive an input signal.

10. A method of receiving a wireless transmission comprising the steps of:
programming a count pattern into an N stage ring counter, wherein N is an integer of value greater than one;
producing an N-cycle digital waveform;
combining said N-cycle digital waveform with said wireless transmission;
oversampling said combined digital waveform and said wireless transmission to form a high speed serial stream, said high speed serial stream comprised of a signal of interest and a quantization noise signal;
suppressing said quantization noise signal;
converting said high speed data stream into a lower speed;
clocking said N stage ring counter with a clock coupled to the counter;

wherein combining includes using an N path switching network;

receiving an output from a respective switch of said N path switching network at a respective predictive coder of at least two predictive coders; and receiving output signals from all of said at least two predictive coders at each of least two (M) digital filters, wherein the outputs of each of the at least two digital filters, each represent one phase state of a phase-shift keyed wireless transmission with M possible phase states, wherein coefficients of the digital filters are adjusted to ensure that "I" and "Q" outputs of the at least two digital filters are amplitude and phase matched notwithstanding timing and gain imperfections in the output signals from all of said at least two predictive coders.

11. A method of receiving a wireless transmission comprising the steps of:

programming a count pattern into an N stage ring counter, wherein N is an integer of value greater than one;

producing an N-cycle digital waveform;

combining said N-cycle digital waveform with said wireless transmission;

oversampling said combined digital waveform and said wireless transmission to form a high speed serial stream, said high speed serial stream comprised of a signal of interest and a quantization noise signal;

suppressing said quantization noise signal;

converting said high speed data stream into a lower speed;

clocking said N stage ring counter with a clock coupled to the counter;

wherein combining includes using an N path switching network;

receiving an output from a respective switch of said N path switching network at a respective predictive coder of at least two predictive coders; and receiving output signals from all of said at least two predictive coders at each of least two (M) digital filters, wherein the outputs of each of the at least two digital filters, each represent one phase state of a phase-shift keyed wireless transmission with M possible phase states, receiving output signals at each of N paths from a switch of the N path switching network, each of the N paths outputting a signal to a predictive coder of the at least two predictive coders, wherein each of the N stage ring counters is configured to produce a different output frequency such that each of N paths processes a relatively narrow subband of a wideband input; said subbands corresponding to each path are arranged in order of ascending frequency; and collectively these subbands cover a wide frequency span.

12. The method of claim 11, wherein the wideband input is an intermediate frequency signal formed by downconverting a wireless transmission.

* * * * *